(12) United States Patent
Kim

(10) Patent No.: US 8,116,158 B2
(45) Date of Patent: Feb. 14, 2012

(54) SEMICONDUCTOR DEVICE GUARANTEEING STABLE OPERATION

(75) Inventor: Hyung-seuk Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 470 days.

(21) Appl. No.: 12/431,019

(22) Filed: Apr. 28, 2009

(65) Prior Publication Data

US 2009/0268535 A1  Oct. 29, 2009

(30) Foreign Application Priority Data

Apr. 28, 2008  (KR) .................. 10-2008-0039347

(51) Int. Cl.
 *G11C 7/02* (2006.01)
(52) U.S. Cl. .... 365/207; 365/203; 365/205; 365/189.17
(58) Field of Classification Search .................. 365/207, 365/203, 205, 189.17
 See application file for complete search history.

(56) References Cited

U.S. PATENT DOCUMENTS

| 7,345,938 B2 * | 3/2008 | Takemura et al. ............ 365/205 |
| 7,929,367 B2 * | 4/2011 | Yoo et al. ...................... 365/222 |
| 2006/0034133 A1 * | 2/2006 | Sekiguchi et al. ............ 365/190 |
| 2007/0237014 A1 * | 10/2007 | Komura et al. ............... 365/203 |
| 2008/0049529 A1 * | 2/2008 | Ohsawa ........................ 365/205 |
| 2008/0175085 A1 * | 7/2008 | Barth et al. ............. 365/210.15 |

FOREIGN PATENT DOCUMENTS

| JP | 05-074149 | 3/1993 |
| JP | 06-103755 | 4/1994 |
| KR | 1020020074024 A | 9/2002 |
| KR | 1020050017760 A | 2/2005 |

* cited by examiner

*Primary Examiner* — Tuan T Nguyen
*Assistant Examiner* — Toan Le
(74) *Attorney, Agent, or Firm* — F. Chau & Associates, LLC

(57) ABSTRACT

A semiconductor device includes a data line pair formed of a data line and a complementary data line; a first sensing amplification unit including a first sensing amplifier and a second sensing amplifier that are cross-coupled with the data line and the complementary data line; a first variable current source supplying or flowing out a first variable current to the first sensing amplifier; and a second variable current source supplying or flowing out a second variable current to the second sensing amplifier. A current amount of the first variable current is different from a current amount of the second variable current.

21 Claims, 15 Drawing Sheets

SEMICONDUCTOR DEVICE GUARANTEEING STABLE OPERATION

CROSS-REFERENCE TO RELATED APPLICATION

This application claims the benefit of Korean Patent Application No. 10-2008-0039347, filed on 28 Apr. 2008, in the Korean Intellectual Property Office, the disclosure of which is incorporated herein in its entirety by reference.

BACKGROUND

In conventional semiconductor devices, a half VDD precharging method is used to precharge a bitline pair. The half VDD precharging method denotes a method of precharging a bit line and a complementary bitline with a half level of a VDD voltage.

SUMMARY

Exemplary embodiments of the present invention provide a semiconductor device capable of guaranteeing a stable operation.

According to an exemplary embodiment of the present invention, there is provided a semiconductor device comprising: a data line pair consisting of a data line and a complementary data line; a first sensing amplification unit consisting of a first sensing amplifier and a second sensing amplifier that are cross-coupled with the data line and the complementary data line; a first variable current source supplying/extracting a first variable current to/from the first sensing amplifier; and a second variable current source supplying/extracting a second variable current to/from the second sensing amplifier, wherein a current amount of the first variable current is different from a current amount of the second variable current.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
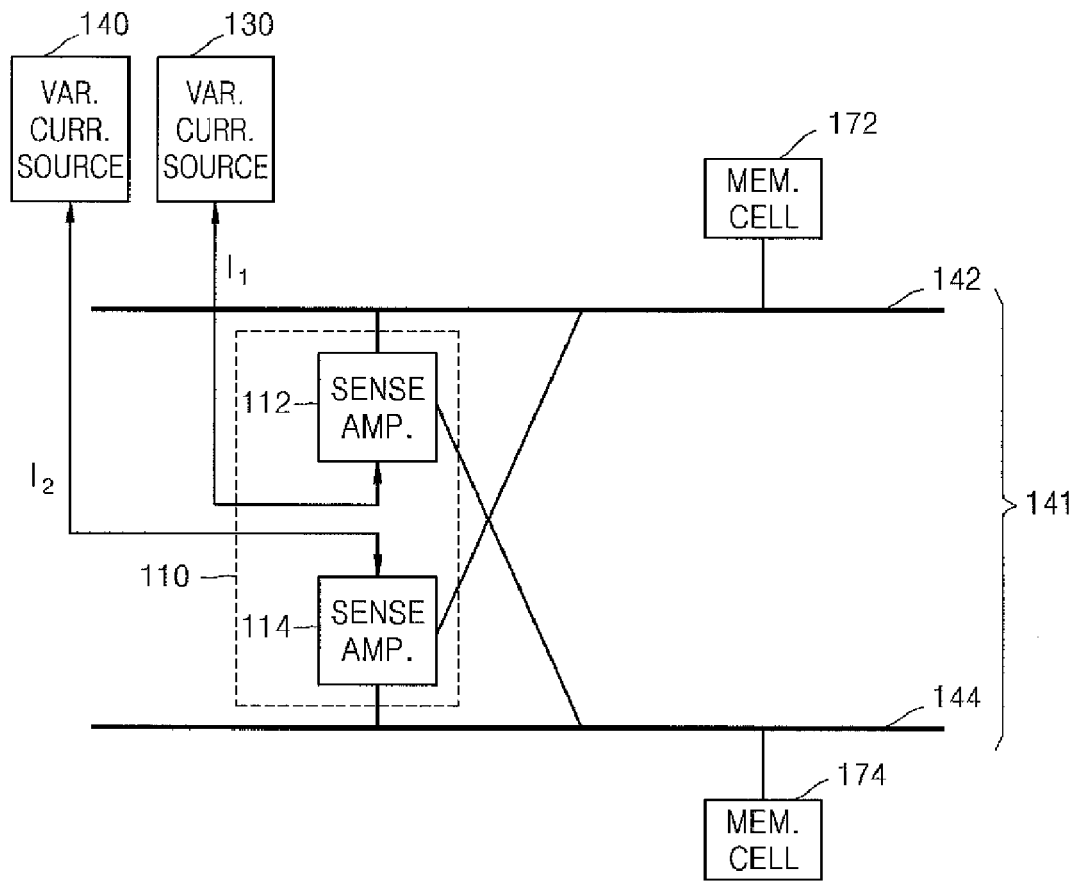
FIG. 1 is a block diagram of a semiconductor device according to an exemplary embodiment of the present invention.

The attached drawings for illustrating exemplary embodiments of the present invention are referred to in order to gain a sufficient understanding of the present invention, the merits thereof, and the objectives accomplished by the implementation of the present invention.

Hereinafter, the present invention will be described in detail by explaining exemplary embodiments of the invention with reference to the attached drawings. Like reference numerals in the drawings denote like elements.

FIG. 1 is a block diagram of a semiconductor device according to an exemplary embodiment of the present invention. Referring to FIG. 1, the semiconductor device includes a data line pair 141, a sensing amplification unit 110, a first variable current source 130, and a second variable current source 140.

The data line pair 141 may include a data line 142 and a complementary data line 144. For example, the data line pair 141 including the data line 142 and the complementary data line 144 may be a bit line pair including a bit line and a complementary bit line. The bit line pair is only an example, and exemplary embodiments of the present invention may be applied to data line pairs other than the bit line pair including a bit line and a complementary bit line.

The sensing amplification unit 110 includes a first sensing amplifier 112 and a second sensing amplifier 114. The first sensing amplifier 112 and the second sensing amplifier 114 are cross-coupled with the data line 142 and the complementary data line 144, respectively. The first variable current source 130 supplies or extracts a first variable current I1 to or from the first sensing amplifier 112, and the second variable current source 140 supplies or extracts a second variable current I2 to or from the second sensing amplifier 114.

The first sensing amplifier 112 and the second sensing amplifier 114 sense the voltage level of the data line pair 141, and amplify the voltage level of the data line pair 141 by supplying or extracting a predetermined current to or from the data line pair 141. The amount of current supplied/extracted by the first sensing amplifier 112 to/from the data line 142 may vary according to the voltage level of the complementary data line 144. The amount of current supplied/extracted by the second sensing amplifier 114 to/from the complementary data line 144 may vary according to the voltage level of the data line 142. For example, when the voltage level of the data line 142 is increased, the amount of current supplied/extracted by the second sensing amplifier 114 may be decreased. Alternatively, when the voltage level of the data line 142 is increased, the amount of current supplied/extracted by the second sensing amplifier 114 may be increased. Also, when the voltage level of the data line 142 is equal to the voltage level of the complementary data line 144 and the first variable current I1 is greater than the second variable current I2, the first sensing amplifier 112 that has received the first variable current I1 may supply/extract a current to/from the data line 142, and the second sensing amplifier 114 that has received the second variable current I2, which is less than the first variable current I1, may not supply/extract a current to/from the complementary data line 144.

If it is assumed that the amount of the first variable current I1 supplied/extracted to/from the first sensing amplifier 112 is identical with that of the second variable current I2 supplied/extracted to/from the second sensing amplifier 114, when the voltage levels of the data line 142 and the complementary data line 144 are different from each other, the amounts of current supplied/extracted by the first and second sensing amplifiers 112 and 114 to the data line 142 and the complementary data line 144, respectively, differ. Thus, the first and second sensing amplifiers 112 and 114 can properly perform sensing amplification operations. On the other hand, when the voltage levels of the data line 142 and the complementary data line 144 are identical with each other, the amounts of current supplied/extracted by the first and second sensing amplifiers 112 and 114 to/from the data line 142 and the complementary data line 144, respectively, are the same as each other. Thus, it is difficult for the first and second sensing amplifiers 112 and 114 to properly perform sensing amplification operations.

In the semiconductor device according to the current exemplary embodiment, however, the amount of the first variable current I1 supplied/extracted by the first variable current source 130 to/from the first sensing amplifier 112 is different from that of the second variable current I2 supplied/extracted by the second variable current source 140 to/from the second sensing amplifier 114. Because the first sensing amplifier 112 and the second sensing amplifier 114 receive different amounts of current, even when the voltage levels of the data line 142 and the complementary data line 144 are identical with each other, the amounts of current supplied/extracted by the first sensing amplifier 112 and the second sensing amplifier 114 to/from the data line 142 and the complementary data line 144 are set to be different from each other. Accordingly, in both the case where the voltage levels of the data line 142 and the complementary data line 144 are identical with each other and the case where the voltage levels of the data line 142 and the complementary data line 144 are different from each other, the first and second sensing amplifiers 112 and 114 can properly perform sensing amplification operations.

The first sensing amplifier 112 and the second sensing amplifier 114 included in the semiconductor device according to the current exemplary embodiment may be designed so as to supply/extract identical amounts of current under the same condition. In other words, the first sensing amplifier 112 and the second sensing amplifier 114 may be designed so as to have an identical driving ability. Because the semiconductor device according to the current exemplary embodiment supplies/extracts different amounts of current to/from the first sensing amplifier 112 and the second sensing amplifier 114, although the first sensing amplifier 112 and the second sensing amplifier 114 are designed so as to have identical driving abilities, the first sensing amplifier 112 and the second sensing amplifier 114 supply/extract different amounts of current to/from the data line 142 and the complementary data line 144, respectively.

Assuming the first and second sensing amplifiers 112 and 114 are designed to have different driving abilities and identical amounts of current are supplied/extracted to/from the first and second sensing amplifiers 112 and 114, the first and second sensing amplifiers 112 and 114 may supply/extract identical amounts of current to/from the data line pair 141. It is difficult to design the first and second sensing amplifiers 112 and 114, however, so as to have different driving abilities over a single layout. In the semiconductor device according to the current exemplary embodiment, however, because different amounts of current are supplied/extracted to/from the first and second sensing amplifiers 112 and 114, the first and second sensing amplifiers 112 and 114 can be designed identically over a single layout, and thus difficulties in the designing process do not occur.

In exemplary embodiments of the present invention, the first and second sensing amplifiers 112 and 114 may be designed so as to have different driving abilities, and different amounts of current may be supplied/extracted to/from the first and second sensing amplifiers 112 and 114. In this case, in order to supply/extract different amounts of current to/from the data line pair 141, either adjustment of a difference between the driving abilities and the first and second sensing amplifiers 112 and 114 or adjustment of the amounts of current supplied/extracted to/from the first and second sensing amplifiers 112 and 114 may be employed.

According to which of a first memory cell 172 connected to the data line 142 and a second memory cell 174 connected to the complementary data line 144 is selected, the current amounts of the first and second variable currents I1 and I2 can be changed. When the first memory cell 172 connected to the data line 142 is selected, the second variable current I2 may be adjusted to be greater than the first variable current I1. On the other hand, when the second memory cell 174 connected to the complementary data line 144 is selected, the second variable current I2 may be adjusted to be less than the first variable current I1. In other words, when the first memory cell 172 is selected, a greater amount of current is supplied/extracted to/from the second sensing amplifier 114 than to the first sensing amplifier 112. When the second memory cell 174 is selected, a greater amount of current is supplied/extracted to/from the first sensing amplifier 112 than to the second sensing amplifier 114. As described above, because a greater amount of current is supplied to one of the first and second sensing amplifiers 112 and 114, even when the voltage levels of the data line 142 and the complementary data line 144 are identical with each other, one of the voltage levels of the data line 142 and the complementary data line 144 can be changed.

Before the data line pair 141 is sensed and amplified, the data line pair 141 may be precharged with a predetermined voltage level. For example, the data line pair 141 may be precharged with a ground voltage or a power supply voltage. When the data line pair 141 is precharged with the ground voltage, the first and second variable current sources 130 and 140 supply the first and second variable currents I1 and I2 to the first and second sensing amplifiers 112 and 114, respectively. The first and second sensing amplifiers 112 and 114 supply predetermined currents to the data line pair 141 so as to increase the voltage level of the data line pair 141. On the other hand, when the data line pair 141 is precharged with the power supply voltage, the first and second variable current sources 130 and 140 extract the first and second variable currents I1 and I2 from the first and second sensing amplifiers 112 and 114, respectively. The first and second sensing amplifiers 112 and 114 extract predetermined amounts of current from the data line pair 141 so as to lower the voltage level of the data line pair 141.

When the data line pair 141 is precharged with the ground voltage and the first memory cell 172 having data '0' is selected, the voltage level of the data line 142 connected to the first memory cell 172 is identical with the voltage level of the complementary data line 144. Because the data line pair 141 has been precharged with the ground voltage, the first and second variable current sources 130 and 140 supply the first and second variable currents I1 and I2, respectively. In addition, because the first memory cell 172 is selected, the second variable current I2 supplied to the second sensing amplifier 114 is greater than the first variable current I1 supplied to the first sensing amplifier 112. Accordingly, the voltage level of the complementary data line 144 increases.

On the other hand, when the data line pair 141 is precharged with the ground voltage and the first memory cell 172 having data '1' is selected, the voltage level of the data line 142 is greater than the voltage level of the complementary data line 144. Because the data line pair 141 has been precharged with the ground voltage, the first and second variable current sources 130 and 140 supply the first and second variable currents I1 and I2. In addition, because the voltage level of the data line 142 is high, the amount of current supplied to the first sensing amplifier 112 increases, and thus the voltage level of the data line 142 increases.

A sensing amplification operation of the data line pair 141 performed after the data line pair 141 has been precharged with the power supply voltage corresponds to a precharge of the data line pair 141 with the ground voltage, except that the first and second variable currents I1 and I2 are caused to flow out of the first and second sensing amplifiers 112 and 114. Thus, a detailed description of the sensing amplification operation of the data line pair 141 will be omitted.

Figure 2:
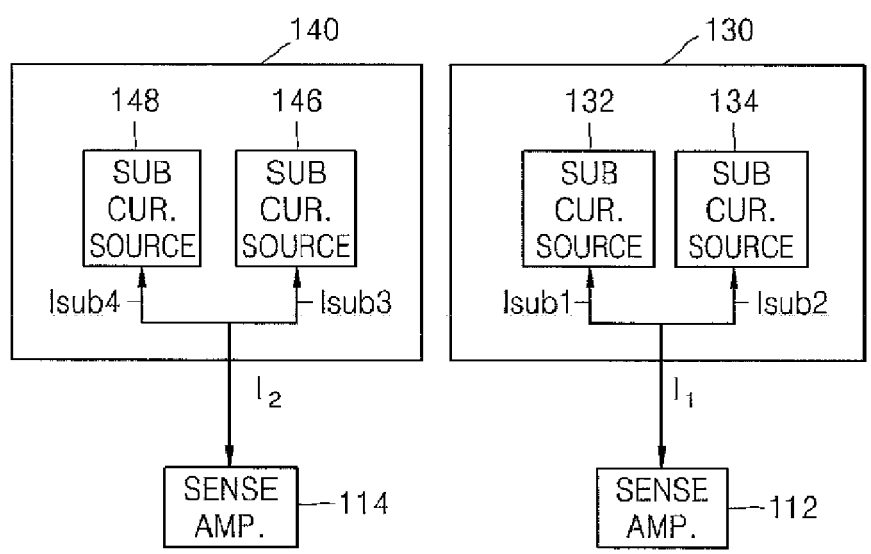
FIG. 2 is a block diagram illustrating detailed structures of a first variable current source and a second variable current source of the semiconductor device illustrated in FIG. 1.

FIG. 2 is a block diagram illustrating detailed structures of the first variable current source 130 and the second variable current source 140 illustrated in FIG. 1. Referring to FIG. 2, the first and second variable current sources 130 and 140 may include a first sub current source 132 and a second sub current source 134 and a third sub current source 146 and a fourth sub current source 148, respectively. The first sub current source 132 and the second sub current source 134 included in the first variable current source 130 are connected to each other in parallel, and the third sub current source 146 and the fourth sub current source 148 included in the second variable current source 140 are connected to each other in parallel.

The first sub current source 132 and the third sub current source 146 are always activated, while the second sub current source 134 and the fourth sub current source 148 are each selectively activated. Accordingly, the current amount of the first variable current I1 supplied by the first variable current source 130 and the current amount of the second variable current I2 supplied/flowed out by the second variable current source 140 can be changed. For example, when the first memory cell 172 connected to the data line 142 is selected, the second sub current source 134 may be inactivated and the fourth sub current source 148 may be activated. In this case, the current amount of the second variable current I2 is greater than the current amount of the first variable current I1. On the other hand, when the second memory cell 174 connected to the complementary data line 144 is selected, the second sub current source 134 may be activated and the fourth sub current source 148 may be inactivated. In this case, the current amount of the first variable current I1 is greater than the current amount of the second variable current I2.

The first through fourth sub current sources 132, 134, 146, and 148 may be manufactured so as to supply or flow out identical amounts of current.

Figure 3:
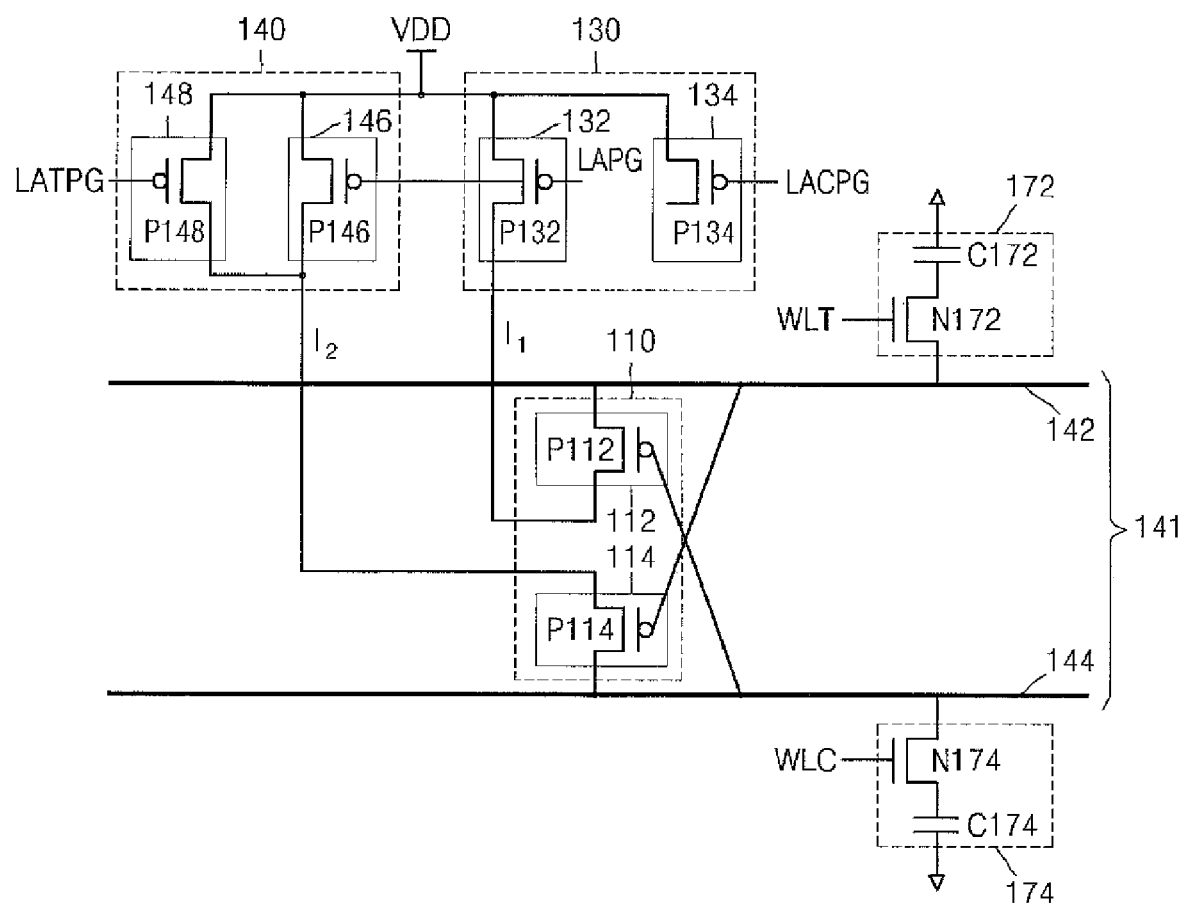
FIG. 3 is a circuit diagram of the semiconductor device illustrated in FIG. 1, according to an exemplary embodiment of the present invention.

FIG. 3 is a circuit diagram of the semiconductor device illustrated in FIG. 1, according to an exemplary embodiment of the present invention. The semiconductor device illustrated in FIG. 3 is constructed so as to be precharged with a ground voltage.

Referring to FIG. 3, the first and second variable current sources 130 and 140 increase the voltage level of the data line pair 141 that has already been precharged with a ground voltage, by supplying the first and second variable currents I1 and I2 to the data line pair 141.

The first variable current source 130 may include two PMOS transistors, namely, first and second PMOS transistors P132 and P134, and the second variable current source 140 may include two PMOS transistors, namely, third and fourth PMOS transistors P146 and P148. The first through fourth PMOS transistors P132, P134, P146, and P148 may respectively serve as the first through fourth sub current sources 132, 134, 146, and 148 shown in FIG. 2. The first and second sensing amplifiers 112 and 114 of the sensing amplification unit 110 may include a PMOS transistor as a first sensing amplification transistor P112 and a PMOS transistor as a second sensing amplification transistor P114, respectively.

The first PMOS transistor P132 and the third PMOS transistor P146 supply currents in response to a first control signal LAPG. The second PMOS transistor P134 supplies a current in response to a second control signal LACPG. The fourth PMOS transistor P148 supplies a current in response to a third control signal LATPG.

The first through fourth PMOS transistors P132, P134, P146, and P148 may be designed so as to have identical sizes. In addition, the first sensing amplification transistor P112 and the second sensing amplification transistor P114 may be designed so as to have identical sizes. Accordingly, problems can be prevented from occurring during a process of manufacturing transistors of different sizes on a single layout. On the other hand, the first through fourth PMOS transistors P132, P134, P146, and P148 could also be designed to have different sizes. In addition, the first sensing amplification transistor P112 and the second sensing amplification transistor P114 may be designed to have different sizes.

Figure 4:
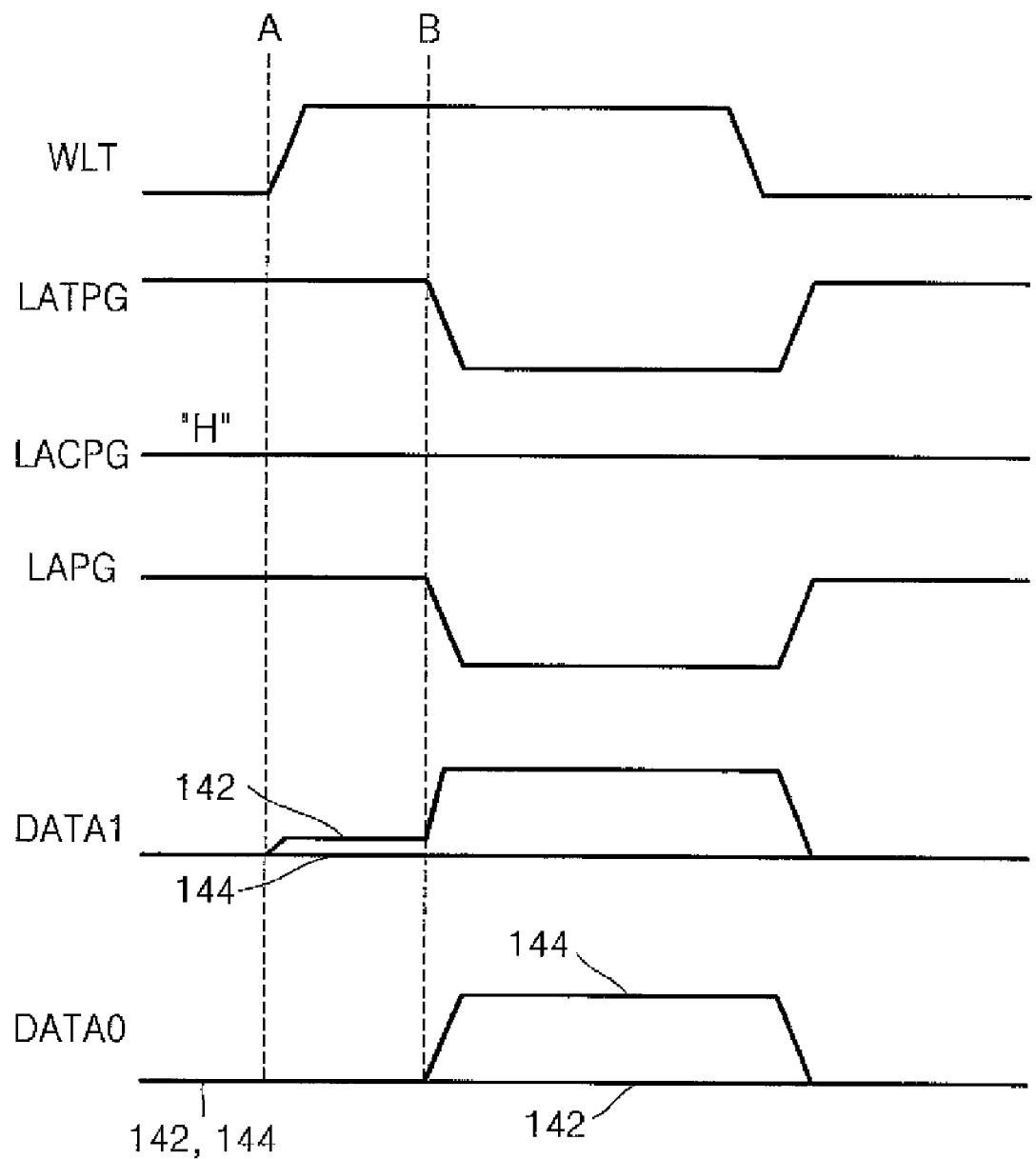
FIG. 4 is a timing diagram for describing a case where a first memory cell illustrated in FIG. 3 is selected.

FIG. 4 is a timing diagram for describing a case where the first memory cell 172 of FIG. 3 is selected.

The case where the first memory cell 172 is selected will now be described with reference to FIGS. 3 and 4. When the logic level of a first memory cell control signal WLT transitions to logic high, the first memory cell 172 is selected. If data stored in the first memory cell 172 is '1', that is, if a first capacitor C172 is charged with an electric charge, the electric charge of the first capacitor C172 is shared with the data line 142. Accordingly, the voltage level of the data line 142 is increased to be greater than the voltage level of the complementary data line 144, which is the precharged ground voltage level. On the other hand, if the data stored in the first memory cell 172 is '0', that is, if the first capacitor C172 is not charged with an electric charge, the voltage level of the data line 142 stays the same precharged ground voltage level as that of the complementary data line 144.

After the first memory cell 172 is selected due to a transition of the logic level of the first memory cell control signal WLT to logic high, logic levels of the first control signal LAPG and the third control signal LATPG transition to logic low, and the second control signal LACPG maintains logic high. Accordingly, the first PMOS transistor P132, the third PMOS transistor P142, and the fourth PMOS transistor P144 are turned on, and the second PMOS transistor P134 is turned off. In this case, the first variable current I1 is a current flowing in the first PMOS transistor P132, and the second variable current I2 is a sum of current flowing in the third PMOS transistor P142 and current flowing in the fourth PMOS transistor P144. In other words, the second variable current I2 is greater than the first variable current I1.

When the voltage level of the data line 142 is increased to be higher than that of the complementary data line 144 due to the storage of data '1' in the first memory cell 172 and charge is shared between the data line 142 and the first memory cell 172, the level of a voltage applied to a gate of the second sensing amplification transistor P114 is increased to be higher than that of a voltage applied to a gate of the first sensing amplification transistor P112. Accordingly, the driving ability of the first sensing amplification transistor P112 is increased to be higher than that of the second sensing amplification transistor P114, and the first sensing amplification transistor P112 supplies the first variable current I1 received from the first variable current source 130 to the data line 142 in order to increase the voltage level of the data line 142. Thus, a difference between the voltage levels of the data line 142 and the complementary data line 144 increases.

When the voltage levels of the data line 142 and the complementary data line 144 are identical with each other due to the storage of data '0' in the first memory cell 172, the level of a voltage applied to the gate of the second sensing amplification transistor P114 becomes the same as that of a voltage applied to the gate of the first sensing amplification transistor P112. Because the second variable current I2 is greater than the first variable current I1 when the first memory cell 172 is selected, however, the driving ability of the second sensing amplification transistor P114 is increased to be higher than that of the first sensing amplification transistor P112. Accordingly, the second sensing amplification transistor P114 supplies the second variable current I2 received from the second variable current source 140 to the complementary data line 144, thereby increasing the voltage level of the complementary data line 144. The voltage level of the data line 142 is kept at the precharged ground voltage level, and thus the difference between the voltage levels of the data line 142 and the complementary data line 144 increases.

Figure 5:
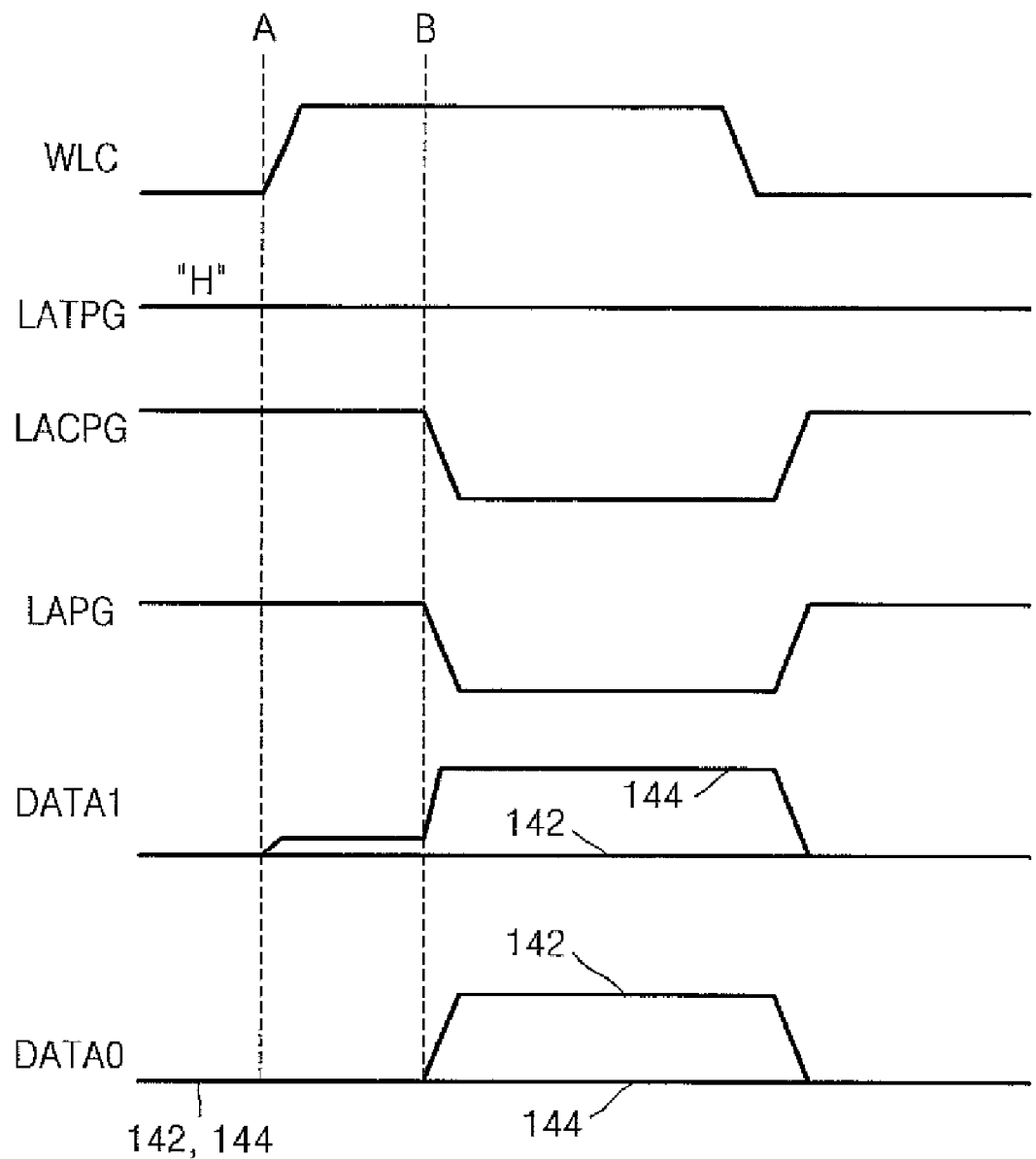
FIG. 5 is a timing diagram for describing a case where a second memory cell illustrated in FIG. 3 is selected.

FIG. 5 is a timing diagram for describing a case where the second memory cell 174 of FIG. 3 is selected.

The case where the second memory cell 174 of FIG. 3 is selected will now be described with reference to FIGS. 3 and 5. When the logic level of a second memory cell control signal WLC transitions to logic high, the second memory cell 174 is selected. If data stored in the second memory cell 174 is '1', that is, if a second capacitor C174 is charged with an electric charge, the electric charge of the second capacitor C174 is shared with the complementary data line 144. Accordingly, the voltage level of the complementary data line 144 is increased to be greater than that of the data line 142. On the other hand, if the data stored in the second memory cell 174 is '0', that is, if the second capacitor C174 is not charged with an electric charge, the voltage level of the complementary data line 144 stays the same as that of the data line 142.

After the second memory cell 174 is selected due to a transition of the logic level of the second memory cell control signal WLC to logic high, logic levels of the first control signal LAPG and the second control signal LACPG transition to logic low, and the third control signal LATPG maintains logic high. Accordingly, the first PMOS transistor P132, the second PMOS transistor P134, and the third PMOS transistor P146 are turned on, and the fourth PMOS transistor P148 is turned off. In this case, the first variable current I1 is a sum of current flowing in the first PMOS transistor P132 and current flowing in the second PMOS transistor P134 and the second variable current I2 is a current flowing in the third PMOS transistor P146. In other words, the second variable current I2 is less than the first variable current I1.

When the voltage level of the complementary data line 144 is increased to be higher than that of the data line 142 due to the storage of data '1' in the second memory cell 174 and the sharing of charge between the complementary data line 144 and the second memory cell 174, the level of a voltage applied to the gate of the first sensing amplification transistor P112 is increased to be higher than that of a voltage applied to the gate of the second sensing amplification transistor P114. Accordingly, the driving ability of the second sensing amplification transistor P114 is increased to be higher than that of the first sensing amplification transistor P112, and the second sensing amplification transistor P114 supplies the second variable current I2 received from the second variable current source 140 to the complementary data line 144 in order to increase the voltage level of the complementary data line 144. The voltage level of the data line 142 is kept at a ground voltage level, and thus the difference between the voltage levels of the data line 142 and the complementary data line 144 increases.

When the voltage levels of the complementary data line 144 and the data line 142 are identical with each other due to the storage of data '0' in the second memory cell 174, the level of a voltage applied to the gate of the first sensing amplification transistor P112 becomes the same as that of a voltage applied to the gate of the second sensing amplification transistor P114. Because the first variable current I1 is greater than the second variable current I2 when the second memory cell 174 is selected, however, the driving ability of the first sensing amplification transistor P112 is increased to be higher than that of the second sensing amplification transistor P114. Accordingly, the first sensing amplification transistor P112 supplies the first variable current I1 received from the first variable current source 130 to the data line 142, thereby increasing the voltage level of the data line 142. The voltage level of the complementary data line 144 is kept at a ground voltage level, and thus the difference between the voltage levels of the data line 142 and the complementary data line 144 increases.

Figure 6:
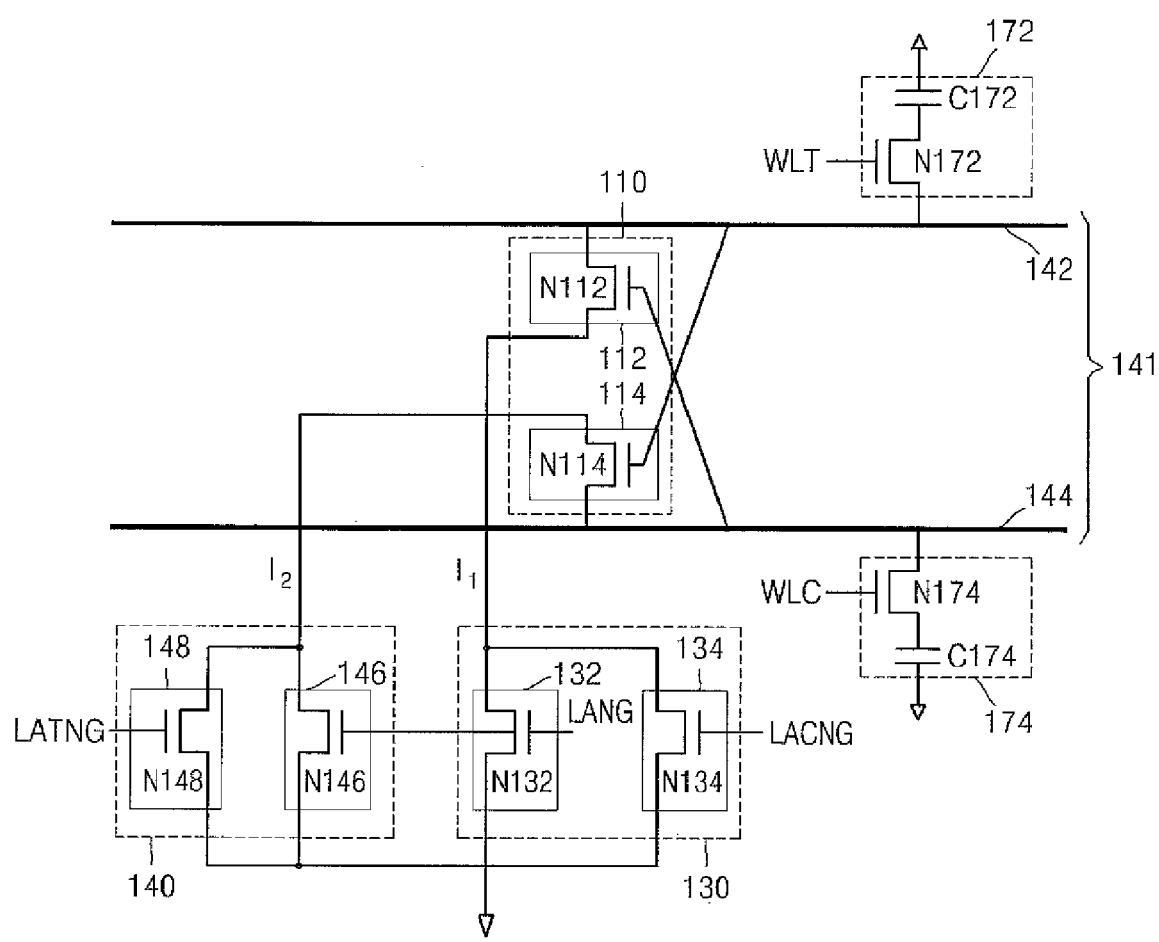
FIG. 6 is a circuit diagram of the semiconductor device illustrated in FIG. 1, according to an exemplary embodiment of the present invention.

FIG. 6 is a circuit diagram of the semiconductor device illustrated in FIG. 1, according to an exemplary embodiment of the present invention. The semiconductor device illustrated in FIG. 6 is constructed so as to be precharged with a power supply voltage.

Referring to FIG. 6, the first and second variable current sources 130 and 140 decrease the voltage level of the data line pair 141 that has already been precharged with a power supply voltage, by flowing out the first and second variable currents I1 and I2 to the data line pair 141.

The first variable current source 130 may include two NMOS transistors, namely, first and second NMOS transistors N132 and N134, and the second variable current source 140 may include two NMOS transistors, namely, third and fourth NMOS transistors N146 and N148. The first through fourth NMOS transistors N132, N134, N146, and N148 may respectively serve as the first through fourth sub current sources 132, 134, 146, and 148. The first and second sensing amplifiers 112 and 114 may include an NMOS transistor N112 and an NMOS transistor N114, respectively.

The first NMOS transistor N132 and the third NMOS transistor N146 flow out currents in response to a first control signal LANG. The second NMOS transistor N134 flows out a current in response to a second control signal LACNG. The fourth NMOS transistor N148 flows out a current in response to a third control signal LATNG.

Figure 7:
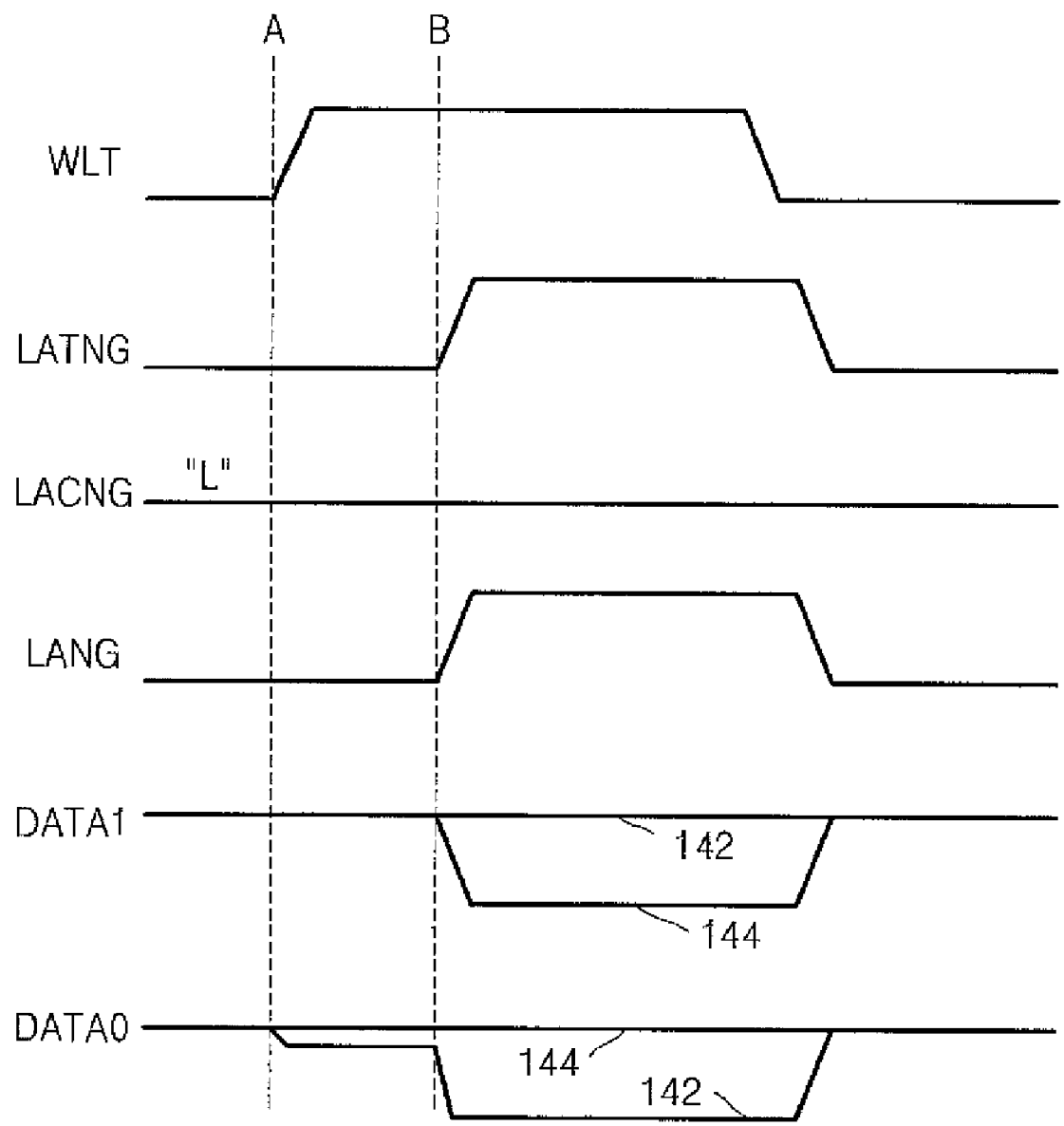
FIG. 7 is a timing diagram for describing a case where a first memory cell illustrated in FIG. 6 is selected.

FIG. 7 is a timing diagram for describing a case where the first memory cell 172 of FIG. 6 is selected.

The case where the first memory cell 172 is selected will now be described with reference to FIGS. 6 and 7. When the logic level of a first memory cell control signal WLT transitions to logic high, the first memory cell 172 is selected. If data stored in the first memory cell 172 is '0', an electric charge is shared between the first capacitor C172 and the data line 142. Accordingly, the voltage level of the data line 142 is decreased from the power supply voltage level to be less than that of the complementary data line 144. On the other hand, if the data stored in the first memory cell 172 is '1', the voltage level of the data line 142 stays the same state as that of the complementary data line 144, which is the precharged power supply voltage level.

After the first memory cell 172 is selected due to a transition of the logic level of the first memory cell control signal WLT to logic high, logic levels of the first control signal LANG and the third control signal LATNG transition to logic low, and the second control signal LACNG maintains logic high. Accordingly, the first NMOS transistor N132, the third NMOS transistor N142, and the fourth NMOS transistor N148 are turned on, and the second NMOS transistor N134 is turned off. In this case, the first variable current I1 is a current flowing in the first NMOS transistor N132, and the second variable current I2 is a sum of the current flowing in the third NMOS transistor N146 and the current flowing in the fourth NMOS transistor N148. In other words, the second variable current I2 is greater than the first variable current I1.

When the voltage level of the data line 142 is decreased to be less than that of the complementary data line 144 due to the storage of data '0' in the first memory cell 172 and the sharing of charge between the data line 142 and the first capacitor C172, the level of a voltage applied to a gate of the second sensing amplification transistor N114 is decreased to be less than that of a voltage applied to a gate of the first sensing amplification transistor N112. Accordingly, the driving ability of the first sensing amplification transistor N112 is increased to be higher than that of the second sensing amplification transistor N114, and the first sensing amplification transistor N112 flows out the first variable current I1 to the first NMOS transistor N132 in order to decrease the voltage level of the data line 142. The voltage level of the complementary data line 144 is kept in the precharged power supply voltage level, and thus a difference between the voltage levels of the data line 142 and the complementary data line 144 increases.

When the voltage levels of the data line 142 and the complementary data line 144 are identical with each other at the power supply voltage level (the precharged voltage level) due to the storage of data '1' in the first memory cell 172, the level of a voltage applied to the gate of the second sensing amplification transistor N114 becomes the same as that of a voltage applied to the gate of the first sensing amplification transistor N112. Because the second variable current I2 is greater than the first variable current I1 when the first memory cell 172 is selected, however, the driving ability of the second sensing amplification transistor N114 is increased to be higher than that of the first sensing amplification transistor N112, Accordingly, the second variable current I2 flows out of the second sensing amplification transistor N114 to the third and fourth NMOS transistors N146 and N148, thereby decreasing the voltage level of the complementary data line 144. The voltage level of the data line 142 is kept at the precharged power supply voltage level, and thus the difference between the voltage levels of the data line 142 and the complementary data line 144 increases.

Figure 8:
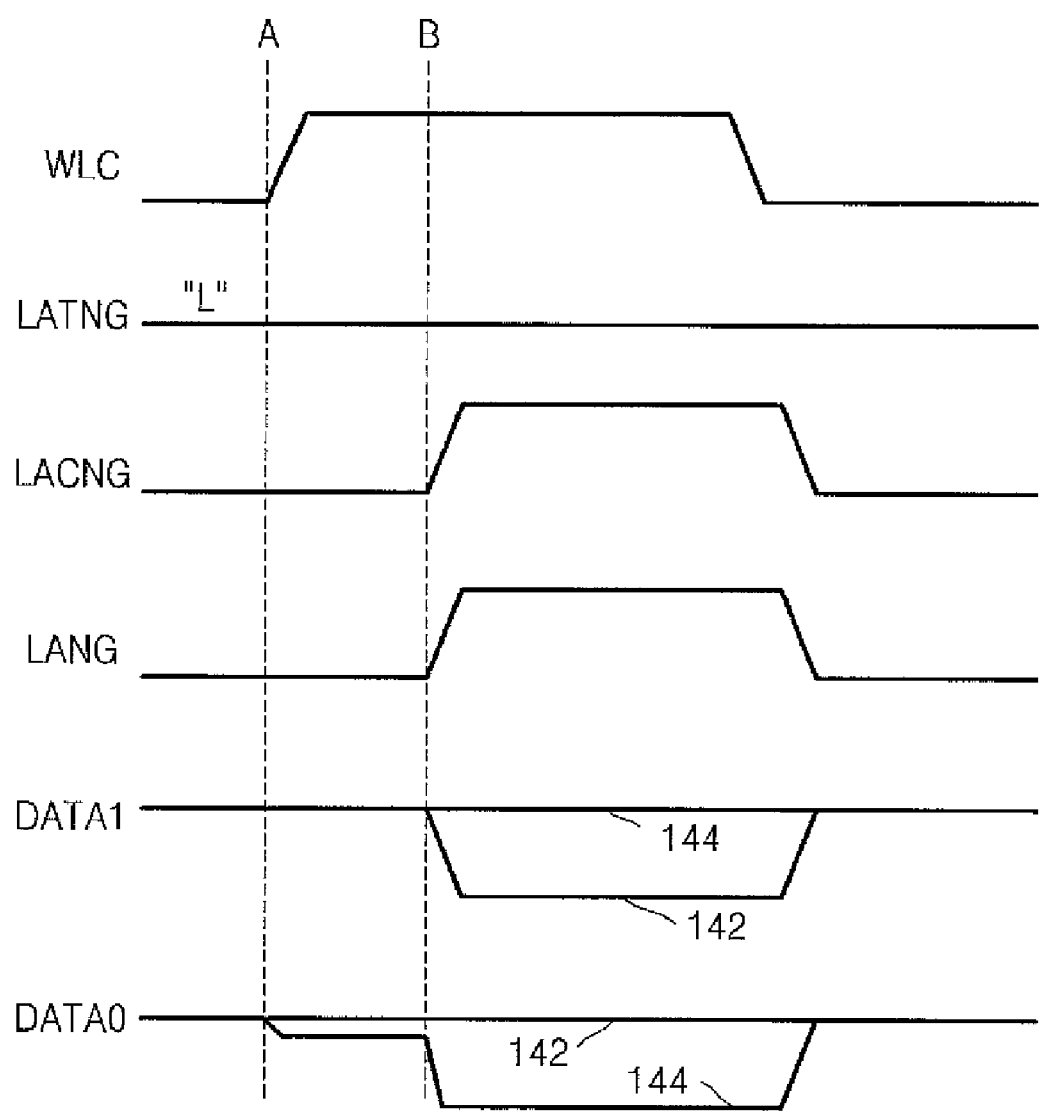
FIG. 8 is a timing diagram for describing a case where a second memory cell illustrated in FIG. 6 is selected.

FIG. 8 is a timing diagram for describing a case where the second memory cell 174 of FIG. 6 is selected.

The case where the second memory cell 174 of FIG. 6 is selected will now be described with reference to FIGS. 6 and 8. If data stored in the second memory cell 174 is '0', an electric charge is shared between the complementary data line 144 and the second capacitor C174. Accordingly, the voltage level of the complementary data line 144 is decreased to be less than that of the data line 142. On the other hand, if the data stored in the second memory cell 174 is '1', the voltage level of the complementary data line 144 stays the same state as that of the data line 142.

After the second memory cell 174 is selected due to a transition of the logic level of the second memory cell control signal WLC to logic high, logic levels of the first control signal LANG and the second control signal LACNG transition to logic high, and the third control signal LATNG maintains logic low. Accordingly, the first NMOS transistor N132, the second NMOS transistor N134, and the third NMOS transistor N146 are turned on, and the fourth NMOS transistor N148 is turned off. In this case, the first variable current I1 is a sum of current flowing in the first NMOS transistor N132 and current flowing in the second NMOS transistor N134 and the second variable current I2 is a current flowing in the third NMOS transistor N146. In other words, the second variable current I2 is less than the first variable current I1.

When the voltage level of the complementary data line 144 is decreased to be less than that of the data line 142 due to the storage of data '0' in the second memory cell 174 and the sharing of charge between the complementary data line 144 and the second capacitor C174, the level of a voltage applied to the gate of the first sensing amplification transistor N112 is decreased to be less than that of a voltage applied to the gate of the second sensing amplification transistor N114. Accordingly, the driving ability of the second sensing amplification transistor N114 is increased to be higher than that of the first sensing amplification transistor N112, and the second variable current I2 flows out of the second sensing amplification transistor N114 to the third NMOS transistor N146 in order to decrease the voltage level of the complementary data line 144. The voltage level of the data line 142 is kept in a power supply voltage level, and thus the difference between the voltage levels of the data line 142 and the complementary data line 144 increases.

When the voltage levels of the complementary data line 144 and the data line 142 are identical with each other at a power supply voltage level, that is, the a precharged voltage level, due to the storage of data '1' in the second memory cell 174, the level of a voltage applied to the gate of the second sensing amplification transistor N114 becomes the same as that of a voltage applied to the gate of the first sensing amplification transistor N112. Because the first variable current I1 is greater than the second variable current I2 when the second memory cell 174 is selected, however, the driving ability of the first sensing amplification transistor N112 is increased to be higher than that of the second sensing amplification transistor N114. Accordingly, the first variable current I1 flows out of the first sensing amplification transistor N112 to the first and second NMOS transistors N132 and N134, thereby decreasing the voltage level of the data line 142. The voltage level of the complementary data line 144 is kept at a power supply voltage level, and thus the difference between the voltage levels of the data line 142 and the complementary data line 144 increases.

Although the first variable current source 130 and the second variable current source 140 of FIG. 3 include PMOS transistors, the PMOS transistors may be replaced with NMOS transistors. All of the PMOS transistors may be replaced by NMOS transistors, however, or only some of the PMOS transistors may be replaced by NMOS transistors. Although the first sensing amplifier 112 and the second sensing amplifier 114 of FIG. 3 include PMOS transistors, the present invention is not limited thereto and, thus, the PMOS transistors may be replaced with NMOS transistors.

Although the first variable current source 130, the second variable current source 140, the first sensing amplifier 112, and the second sensing amplifier 114 of FIG. 6 include NMOS transistors, some of the NMOS transistors may be replaced with PMOS transistors.

Figure 9:
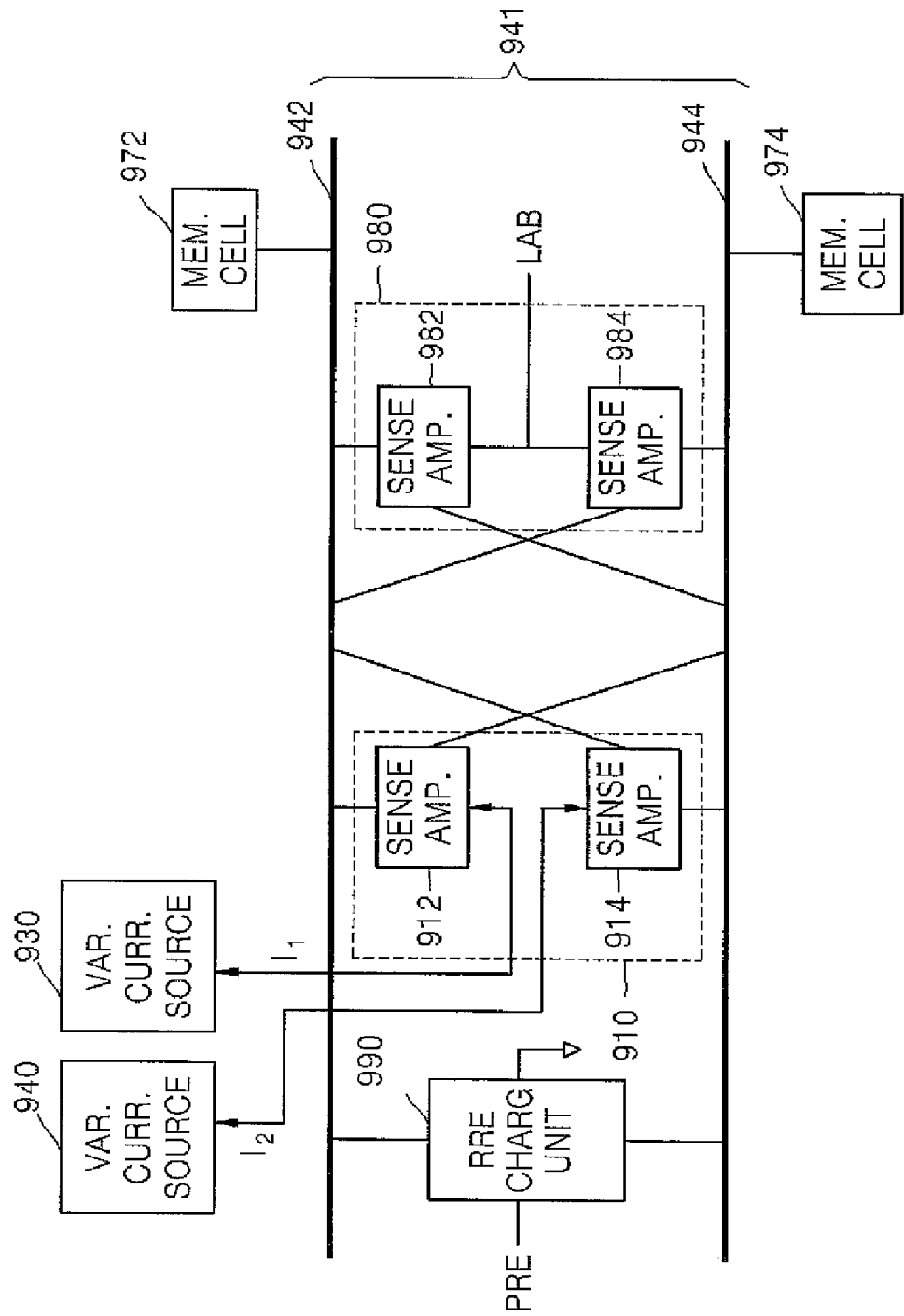
FIG. 9 is a block diagram of a semiconductor device according to an exemplary embodiment of the present invention.

FIG. 9 is a block diagram of a semiconductor device according to an embodiment of the present invention. In contrast with the semiconductor device of FIG. 1, the semiconductor device of FIG. 9 may further include a precharging unit 990 to precharge a data line pair 941 with a power supply voltage or a ground voltage.

In contrast with the semiconductor device of FIG. 1, the semiconductor device of FIG. 9 may her include a second sensing amplification unit 980. The second sensing amplification unit 980 may include a third sensing amplifier 982 and a fourth sensing amplifier 984. The third sensing amplifier 982 and the fourth sensing amplifier 984 may be cross-coupled with a data line 942 and a complementary data line 944.

The third sensing amplifier 982 and the fourth sensing amplifier 984 are activated a predetermined period of time after a first sensing amplification unit 910 is activated, thereby removing an influence of a sensing amplifier having a low driving ability from among the first sensing amplifier 912 and the second sensing amplifier 914. For example, if the first variable current I1 is greater than the second variable current I2, a driving ability of the first sensing amplifier 912 is greater than that of the second sensing amplifier 914. In this case, the voltage level of the data line 942 is changed by the first sensing amplifier 912, as already described above. A second sensing amplifier 914, however, also slightly changes the voltage level of the complementary data line 944. As then seen, a variation of the voltage level of the complementary data line 944 is less than that of the voltage level of the data line 942. In addition, the first sensing amplifier 912 and the second sensing amplifier 914 increase or decrease the voltage level of the data line pair 941. When the voltage level of the complementary data line 944 is changed by a second sensing amplifier 914, a difference between the voltage levels of the data line 942 and the complementary data line 944 decreases. In order to solve the problem of the decrease in the voltage level difference, the third sensing amplifier 982 and the fourth sensing amplifier 984 decrease (or increase) the voltage level of the complementary data line 944, which is increased (or decreased) by the second sensing amplifier 914, after the logic level of a fourth control signal LAB is changed.

Figure 10:
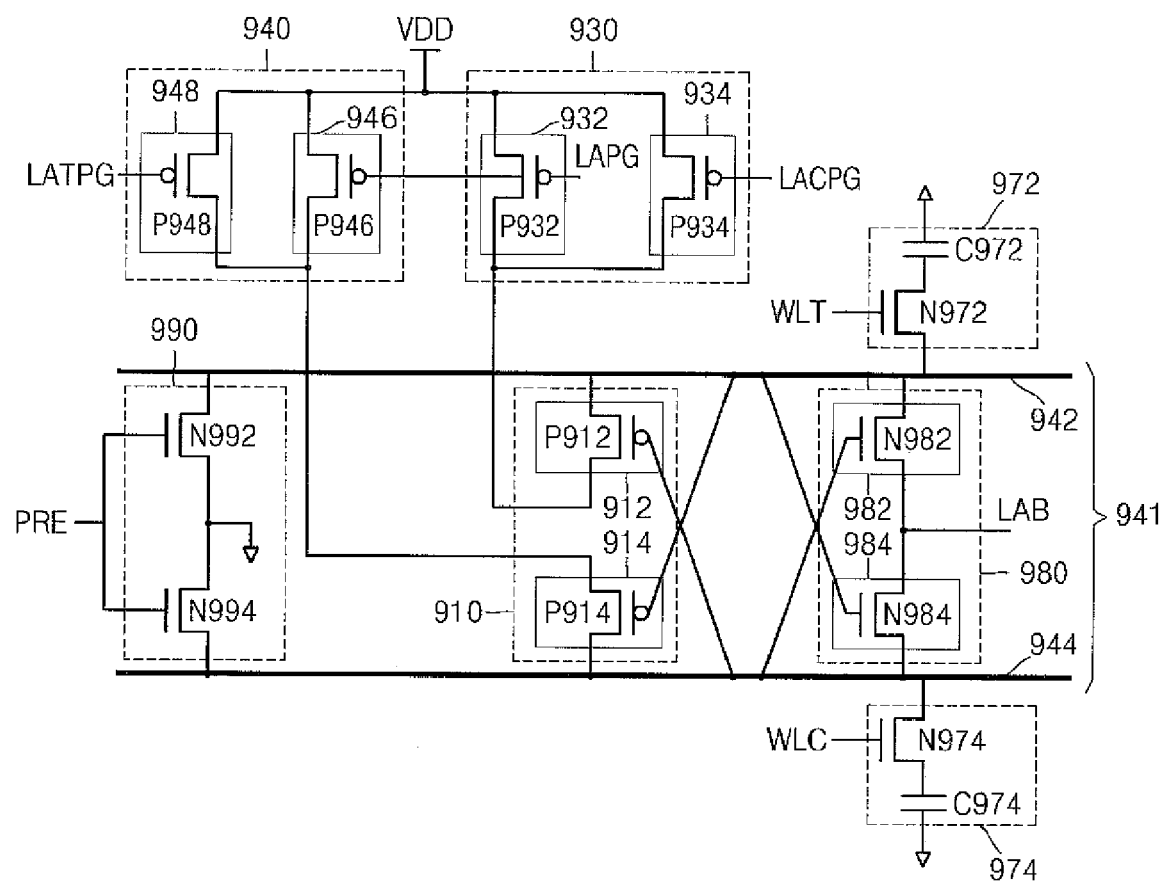
FIG. 10 is a circuit diagram of the semiconductor device illustrated in FIG. 9, according to an exemplary embodiment of the present invention.

FIG. 10 is a circuit diagram of the semiconductor device illustrated in FIG. 9, according to an exemplary embodiment of the present invention.

Referring to FIG. 10, the precharging unit 990 includes a first precharging NMOS transistor N992 and a second precharging NMOS transistor N994. A ground voltage is applied to a common terminal of the first precharging NMOS transistor N992 and the second precharging NMOS transistor N994. The first precharging NMOS transistor N992 and the second precharging NMOS transistor N994 are turned on in response to a precharge control signal PRE and precharge the data line pair 941 with the ground voltage.

The second sensing amplification unit 980 includes a third sensing amplification transistor N982 and a fourth sensing amplification transistor N984. The third sensing amplification transistor N982 and the fourth sensing amplification transistor N984 are cross-coupled with the data line 942 and the complementary data line 944. The remaining elements shown in FIG. 10 but not described, correspond to identical elements already described in regard to the above exemplary embodiments and have corresponding reference numerals.

Figure 11:
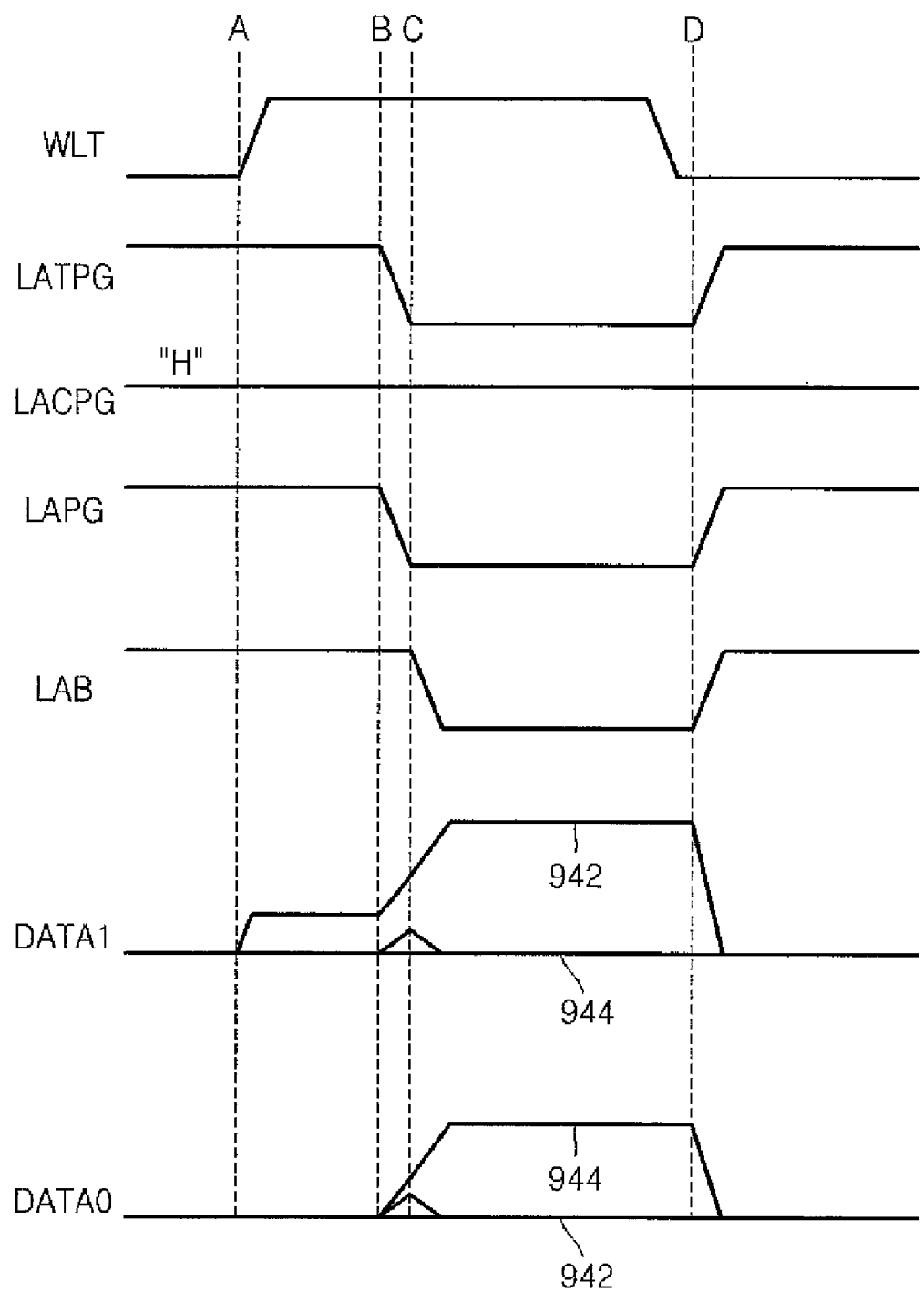
FIG. 11 is a timing diagram for describing an operation of the semiconductor device illustrated in FIG. 10.

FIG. 11 is a timing diagram for describing an operation of the semiconductor device illustrated in FIG. 10.

Referring to FIG. 11, the logic level of the fourth control signal LAB transitions to logic low after the lapse of a predetermined period of time from a point in time when a first control signal LAPG and a third control signal LATPG transition to logic low.

FIG. 11 illustrates an operation of the semiconductor device of FIG. 10 when the first memory cell 972 is selected.

When data stored in the first memory cell 972 is '1', if a first memory cell control signal WLT transitions to logic high within a period A-B, the first memory cell 972 is selected and an electrical charge of a first capacitor C972 is shared with the data line 942. As a result, the voltage level of the data line 942 slightly increases. Meanwhile, the voltage level of the complementary data line 944 is kept at a ground voltage level, that is, the precharged voltage level. Then, if the first control signal LAPG and the third control signal LATPG transition to logic low within a period B-C, a first sensing amplification transistor P912 and a second sensing amplification transistor P914 respectively supply currents to the data line 942 and the complementary data line 944, thereby increasing the voltage levels of the data line 942 and the complementary data line 944. Because the voltage level of the data line 942 is higher than the voltage level of the complementary data line 944 within the period B-C, the level of a voltage applied to a gate of the second sensing amplification transistor P914 is higher than that of a voltage applied to a gate of the first sensing amplification transistor P912. Therefore, an amount by which the voltage level of the complementary data line 944 is increased by the second sensing amplification transistor P914 is less an that by which the voltage level of the data line 942 is increased by the first sensing amplification transistor P912.

Then, the logic level of the fourth control signal LAB transitions to logic low within a period C-D. Within the period C-D, the third sensing amplification transistor N982 and the fourth sensing amplification transistor N984 allow currents to flow out of the data line 942 and the complementary data line 944. Because the voltage level of the data line 942 is higher than the voltage level of the complementary data line 944 within the period C-D, the level of a voltage applied to a gate of the fourth sensing amplification transistor N984 is higher than that of a voltage applied to a gate of the third sensing amplification transistor N982. Therefore, the fourth sensing amplification transistor N984 has a strong driving ability, the voltage level of the data line 942 seldom decreases, and the voltage level of the complementary data line 944 decreases. Thus, the voltage level of the complementary data line 944, which is increased by the first sensing amplification transistor P912 in the period B-C, can be decreased within the period C-D.

When data stored in the first memory cell 972 is '0', the voltage levels of the data line 942 and the complementary data line 944 are kept identical to each other within the period A-B. Then, the logic levels of the first control signal LAPG and the third control signal LATPG transition to logic low within the period B-C, the first sensing amplification transistor P912 and the second sensing amplification transistor P914 respectively supply currents to the data line 942 and the complementary data line 944, thereby increasing the voltage levels of the data line 942 and the complementary data line 944. Within the period B-C, the voltage level of the data line 942 is equal to that of the complementary data line 944, and the second variable current I2 supplied to the second sensing amplification transistor P914 is greater than the first variable current I1 supplied to the first sensing amplification transistor P912. Therefore, an amount by which the voltage level of the complementary data line 944 is increased by the second sensing amplification transistor P914 is higher than that by which the voltage level of the data line 942 is increased by the first sensing amplification transistor P912.

Thereafter, the logic level of the fourth control signal LAB transitions to logic low within the period C-D. Within the period C-D, the third sensing amplification transistor N982 and the fourth sensing amplification transistor N984 allow currents to flow out of the data line 942 and the complementary data line 944, respectively. Because the voltage level of the complementary data line 944 is higher than the voltage level of the data line 942 within the period C-D, the level of the voltage applied to the gate of the third sensing amplification transistor N982 is higher than that of the voltage applied to the gate of the fourth sensing amplification transistor N984. Therefore, the second sensing amplification transistor N982 has a strong driving ability, the voltage level of the complementary data line 944 seldom decreases, and the voltage level of the data line 942 decreases. Thus, the voltage level of the data line 942, which is increased by the FIRST sensing amplification transistor P912 within the period B-C, may be decreased within the period C-D.

Up to now, a transition of the fourth control signal LAB from logic high to logic low has been described. The fourth control signal LAB, however, may be maintained at logic-low. In this case, the third sensing amplification transistor N982 and the fourth sensing amplification transistor N984 may respectively flow out currents to the data line 942 and the complementary data line 944 and, thus, the semiconductor device may perform an operation similar to an operation performed when the fourth control signal LAB transitions from logic high to logic low.

Although a case where the second memory cell 974 is selected is not described in connection with FIG. 10, the case where the second memory cell 974 is selected will be understood by one of ordinary skill in the art by referring to what has been described above, and thus a detailed description thereof will be omitted.

Figure 12:
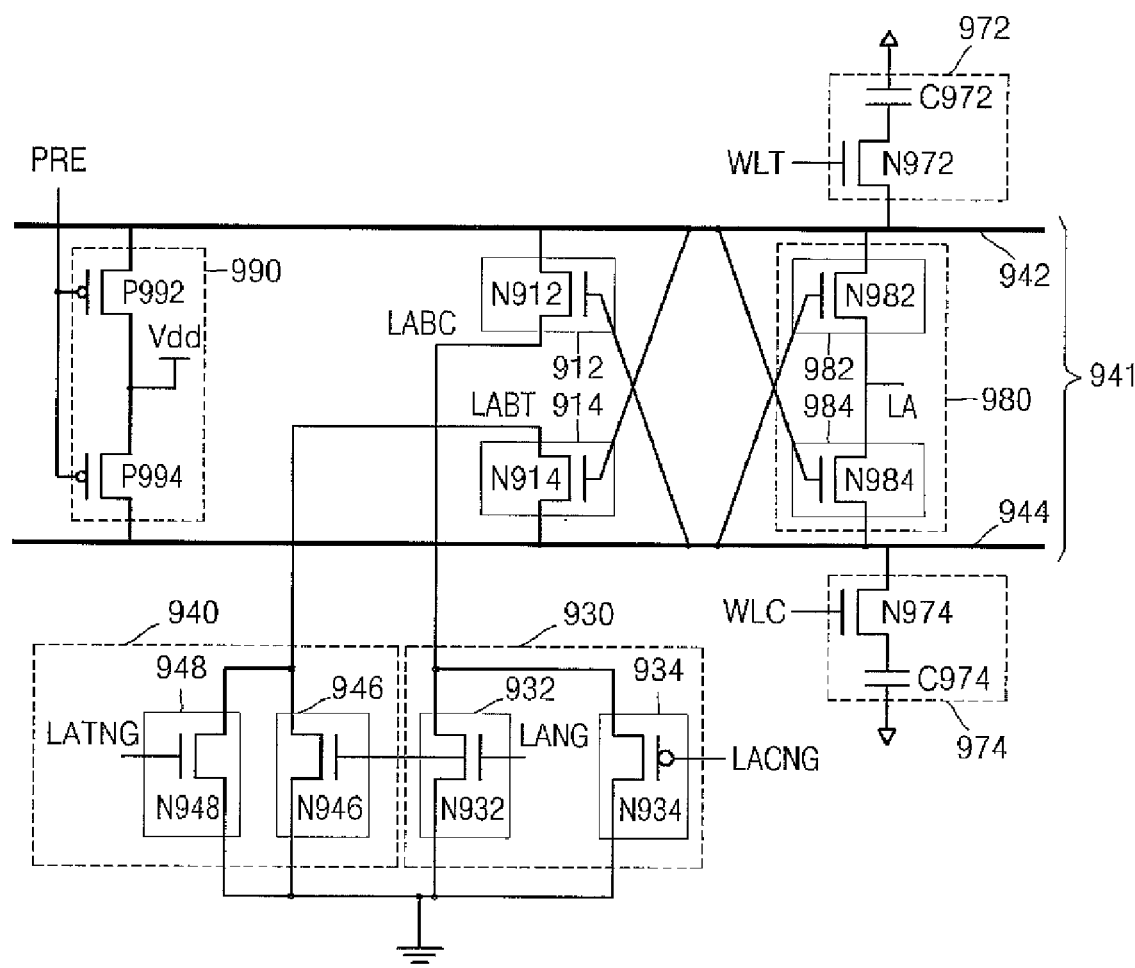
FIG. 12 is a circuit diagram of the semiconductor device illustrated in FIG. 9, according to an exemplary embodiment of the present invention.

FIG. 12 is a circuit diagram of the semiconductor device illustrated in FIG. 9, according to an exemplary embodiment of the present invention.

The semiconductor device of FIG. 10 has such a circuit that can be precharged with a ground voltage, whereas the semiconductor device of FIG. 12 has such a circuit that can be precharged with a power supply voltage. The power supply voltage Vdd is applied to a common terminal of the first precharging NMOS transistor N992 and the second precharging NMOS transistor N994. First and second variable current sources 930 and 940 of FIG. 10 supply currents to a data line pair 941, whereas first and second variable current sources 930 and 940 of FIG. 12 allow currents to flow out of the data line pair 941. Except for this, the components of the semiconductor device of FIG. 12 correspond to those of the semiconductor device of FIG. 10, respectively, and operations of the components of FIG. 12 correspond to those of the components of FIG. 10, respectively. Therefore, a detailed description of an operation of the semiconductor device of FIG. 12 will be omitted.

Referring to FIG. 12, a fifth control signal LA fed to the second sensing amplification unit 980 may be transitioned from logic low to logic high or maintained at logic high.

Figure 13:
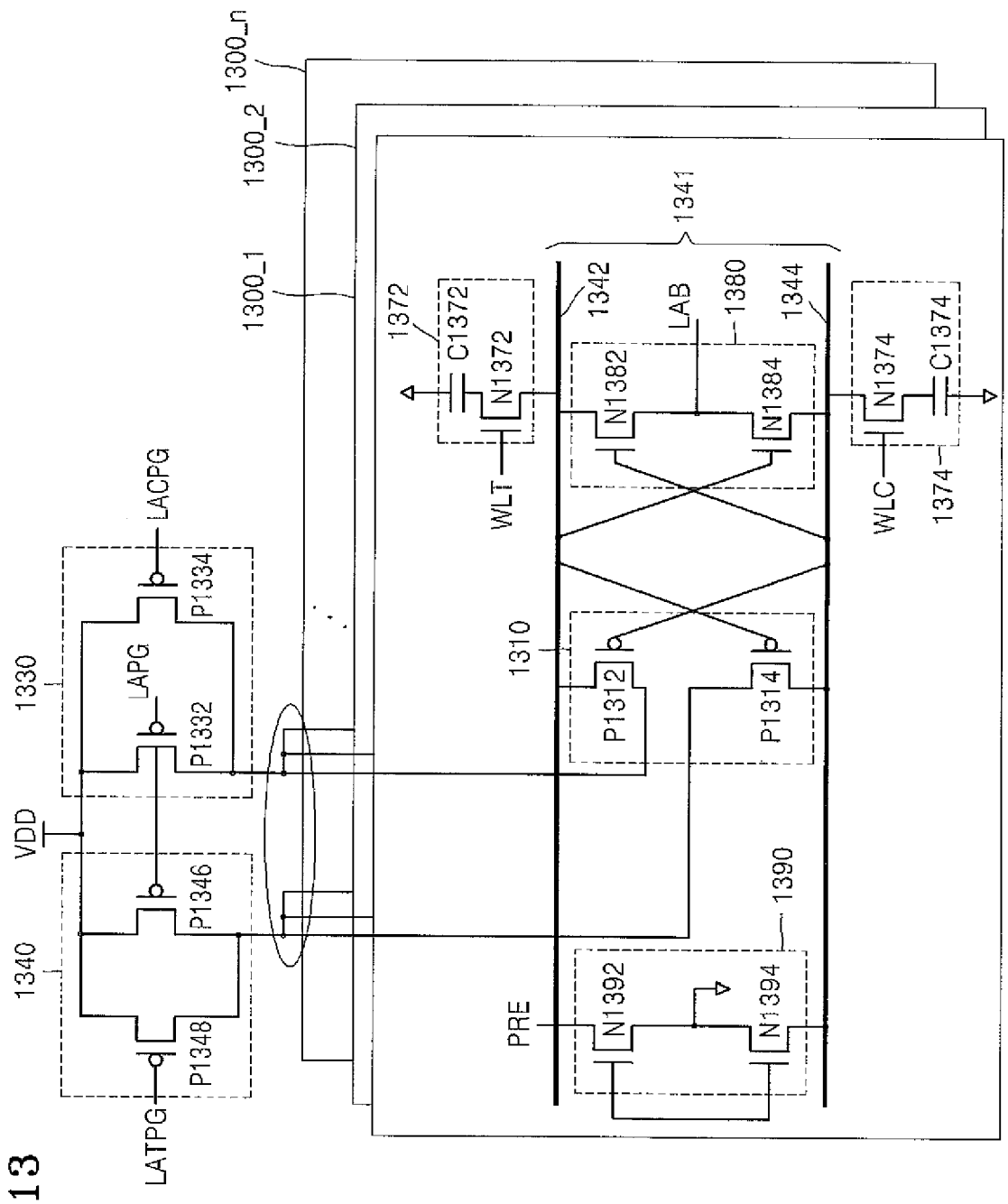
FIG. 13 is a circuit diagram of a semiconductor device according to an exemplary embodiment of the present invention.

FIG. 13 is a circuit diagram of a semiconductor device according to an exemplary embodiment of the present invention.

Referring to FIG. 13, the semiconductor device includes a first variable current source 1330, a second variable current source 1340, and a plurality of first sensing amplification units 1300_1, 1300_2, through to 1300_n. The remaining elements shown in FIG. 13 but not described, correspond to identical elements already described in regard to the above exemplary embodiments and have corresponding reference numerals with two digit suffixes preceded by the figure number. The first sensing amplification units 1300_1, 1300_2, through to 1300_n share the first variable current source 1330 and the second variable current source 1340, as shown by the encircled connections. In other words, the first variable current source 1330 and the second variable current source 1340 supply or flow out currents to the first sensing amplification units 1300_1, 1300_2, through to 1300_n.

Although the semiconductor device illustrated in FIG. 13 includes the single first variable current source 1330 and the single second variable current source 1340, the semiconductor device may also include at least two first variable current sources and at least two second variable current sources. In this case, the first sensing amplification units 1300_1, 1300_2, through to 1300_n may be divided into two or more groups, and thus each of the groups may share a single first variable current source and a single second variable current source.

Figure 14:
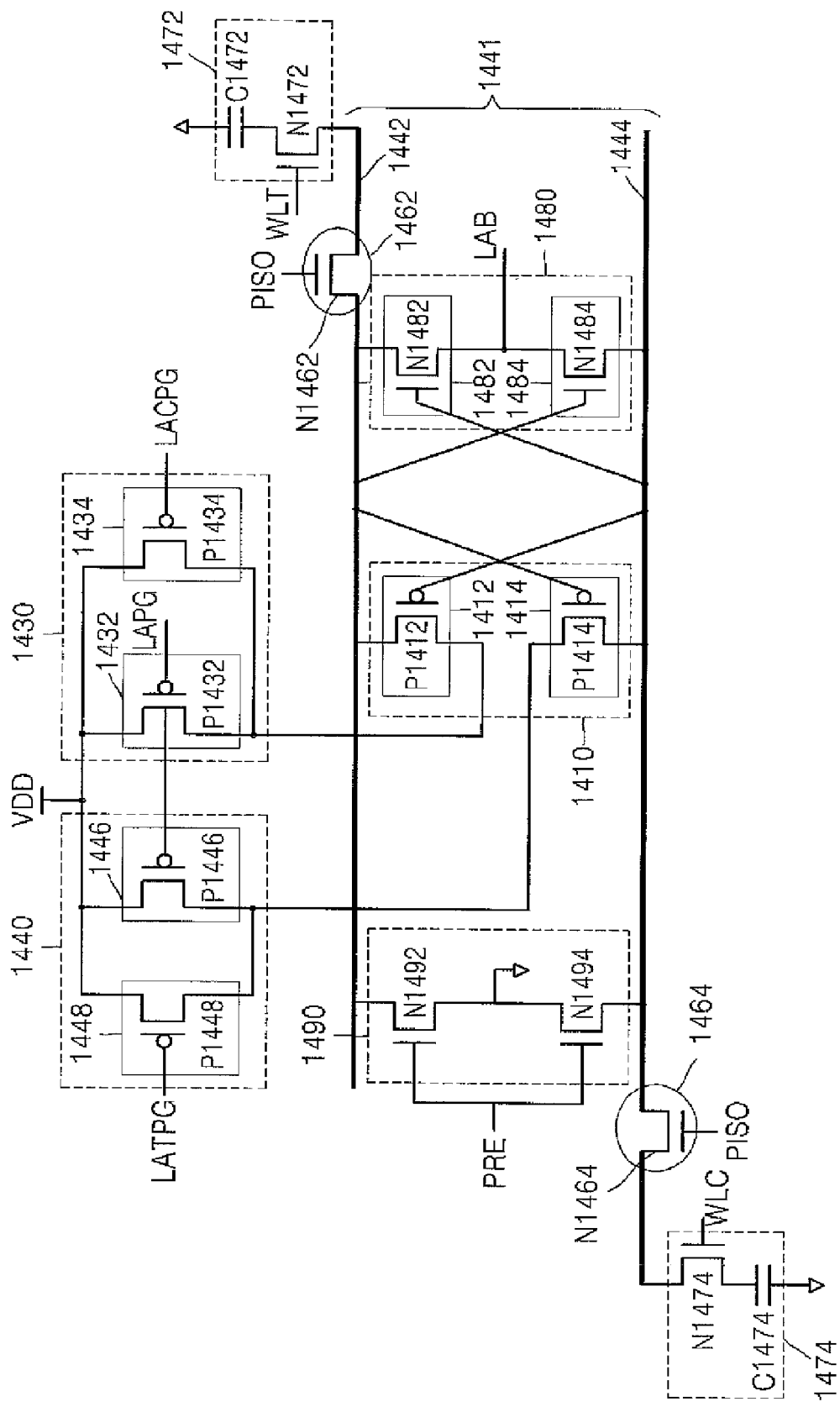
FIG. 14 is a circuit diagram of a semiconductor device according to an exemplary embodiment of the present invention.

FIG. 14 is a circuit diagram of a semiconductor device according to an exemplary embodiment of the present invention. In contrast with the semiconductor device of FIG. 10, the semiconductor device of FIG. 14 further includes a first disconnection unit 1462 and a second disconnection unit 1464.

The first disconnection unit 1462 is installed between a first memory cell 1472 and a data line 1442, and connects the first memory cell 1472 to, or disconnects the first memory cell 1472 from, the data line 1442. The second disconnection unit 1464 is installed between a second memory cell 1474 and a complementary data line 1444, and connects the second memory cell 1474 to or disconnects the second memory cell 1474 from the complementary data line 1444. By disconnecting the first and second memory cells 1472 and 1474 from a data line pair 1441 by using the first and second disconnection units 1462 and 1464 as described above, the load applied to the data line pair 1441 can be reduced.

While data stored in the first memory cell 1472 is being transferred to the data line 1442, the first disconnection unit 1462 connects the first memory cell 1472 to the data line 1442. After the transfer of the data stored in the first memory cell 1472 to the data line 1442 is completed, the first memory cell 1472 may be disconnected from the data line 1442. While data stored in the second memory cell 1474 is being transferred to the complementary data line 1444, the second disconnection unit 1464 connects the second memory cell 1474 to the complementary data line 1444. After the transfer of the data stored in the second memory cell 1474 to the complementary data line 1444 is completed, the second memory cell 1474 may be disconnected from the complementary data line 1444.

Although it is illustrated in FIG. 14 that the first disconnection unit 1462 and the second disconnection unit 1464 include a first disconnection transistor N1462 and a second disconnection transistor N1464, respectively, this is just an example. In other words, the first disconnection transistor N1462 and the second disconnection transistor N1464 may be replaced with other elements that serve as switches. The remaining elements shown in FIG. 14 but not described, correspond to identical elements already described in regard to the above exemplary embodiments and have corresponding reference numerals with two digit suffixes preceded by the figure number.

Up to now, a case where a first sensing amplifier and a second sensing amplifier are cross-coupled with a data line and a complementary data line has been described. Exemplary embodiments of the present invention, however, are not limited to the cross-coupling configuration of the first and second sensing amplifiers, and the first and second sensing amplifiers may be connected to a data line and a complementary data line in various other ways.

In addition, a case where both first and second variable current sources supply variable currents, namely, first and second variable currents, has been described up to now. One of the first variable current source and the second variable current source, however, may supply a variable current and the other may supply a constant current. Therefore, different amounts of current may be supplied to the first sensing amplifier and the second sensing amplifier.

Figure 15:
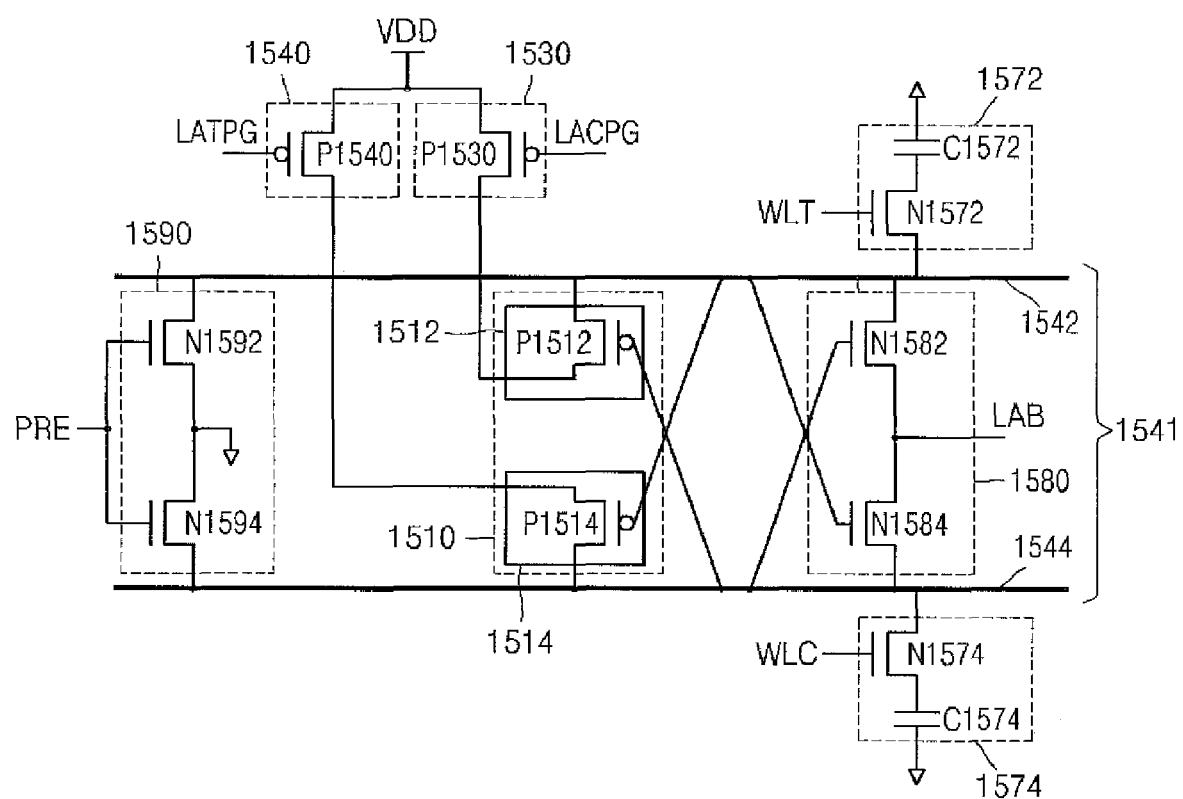
FIG. 15 is a circuit diagram of a semiconductor device according to an exemplary embodiment of the present invention.

FIG. 15 is a circuit diagram of a semiconductor device according to an exemplary embodiment of the present invention. Referring to FIG. 15, the semiconductor device includes a data line pair 1541, a first sensing amplification unit 1510, a second sensing amplification unit 1580, a first current source 1530, and a second current source 1540.

The data line pair 1541 includes a data line 1542 and a complementary data line 1544. The first sensing amplification unit 1510 includes a first sensing amplifier 1512 and a second sensing amplifier 1514. The first sensing amplifier 1512 and the second sensing amplifier 1514 are cross-coupled with the data line 1542 and the complementary data line 1544. The components of the present exemplary embodiment correspond to the components illustrated in FIG. 3, and thus a detailed description thereof will be omitted. That is, the remaining elements shown in FIG. 15 but not described, correspond to identical elements already described in connection with the above exemplary embodiments and have corresponding reference numerals with two digit suffixes preceded by the figure number.

The first current source 1530 supplies a first current to the first sensing amplifier 1512, and the second current source 1540 supplies a second current to the second sensing amplifier 1514. In FIG. 3, the first and second variable current sources 130 and 140 supply the first variable current I1 and the second variable current I2. In FIG. 15, however, the first and second variable current sources 1530 and 1540 may supply constant currents, namely, the first and second currents. As will be seen, however, the first and second currents may also be variable currents.

The time at which the first current source 1530 supplies the first current is different from the time at which the second current source 1540 supplies the second current. For example, when a first memory cell 1572 connected to the data line 1542 is selected, the second current may be supplied prior to the first current. On the other hand, when a second memory cell 1574 connected to the complementary data line 1544 is selected, the first current may be supplied prior to the second current.

Figure 16:
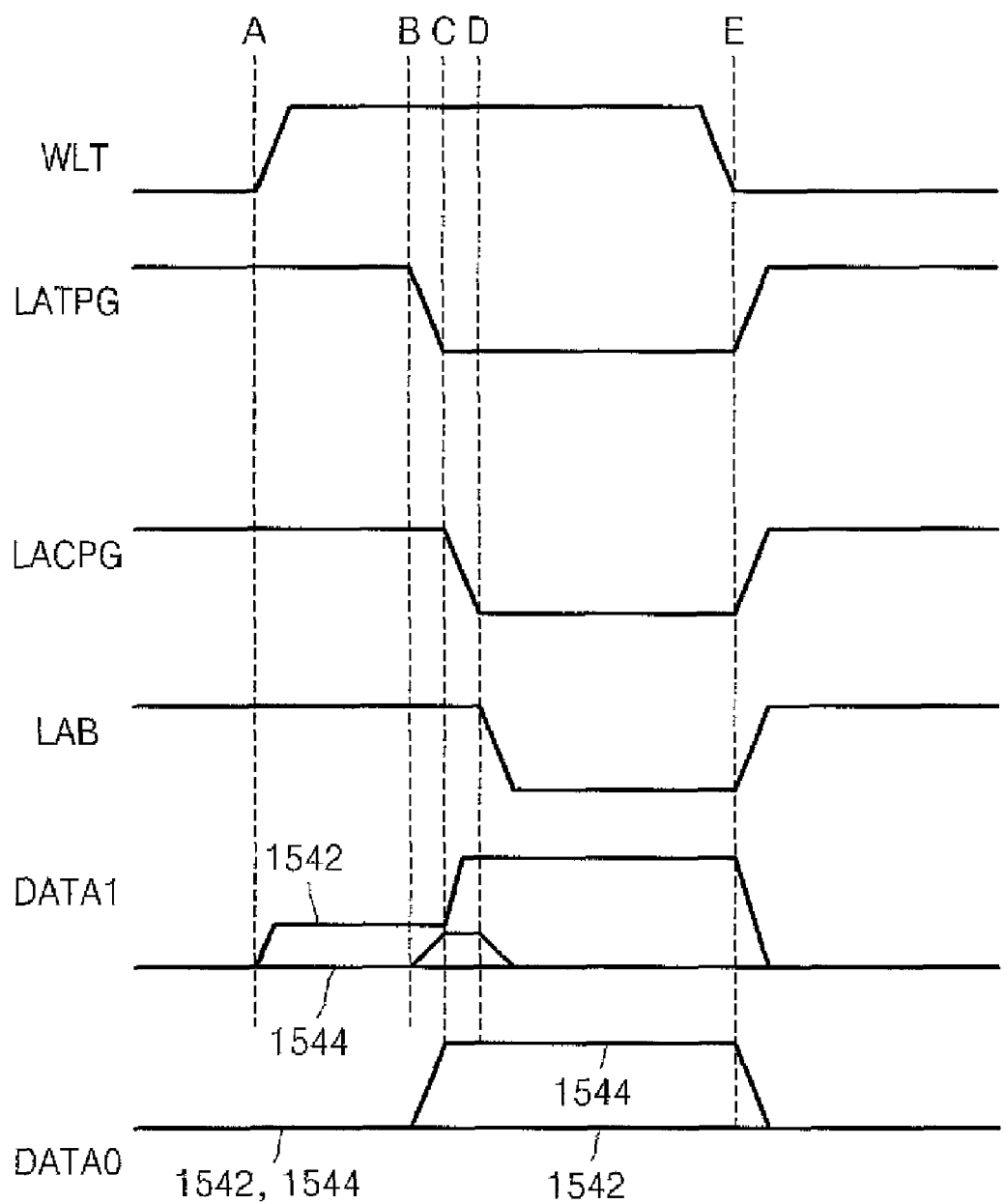
FIG. 16 is a timing diagram for describing an operation of the semiconductor device illustrated in FIG. 15.

FIG. 16 is a timing diagram for describing an operation of the semiconductor device illustrated in FIG. 15. Referring to FIG. 16, when data line pair 1541 is charged with a ground voltage and a first memory cell control signal WLT transitions from logic low to logic high, the first memory cell 1572 is selected.

If data stored in the first memory cell 1572 is '0', the voltage level of the data line 1542 is equal to that of the complementary data line 1544. Then, when a second control signal LATPG transitions from logic high to logic low, the second current is supplied to the second sensing amplification transistor P1514 and, thus, the second sensing amplification transistor P1514 increases the voltage level of the complementary data line 1544 (see a period B-C). Thereafter, when a first control signal LACPG transitions from logic high to logic low at a point in time C, the voltage level of the complementary data line 1544 has already been increased to be higher than that of the data line 1542 at the point in time C. Thus, the level of a voltage applied to a gate of the first sensing amplification transistor P1512 is higher than that of a voltage applied to a gate of the second sensing amplification transistor P1514, and thus the first sensing amplification transistor P1512 fails to increase the voltage level of the data line 1542.

If data stored in the first memory cell 1572 is '1', the voltage level of the data line 1542 is increased to be higher than that of the complementary data line 1544. Then, when the second control signal LATPG transitions from logic high to logic low, the second current is supplied to the second sensing amplification transistor P1514 and, thus, the second sensing amplification transistor P1514 slightly increases the voltage level of the complementary data line 1544 (see a period B-C). Because the voltage level of the data line 1542 is higher than that of the complementary data line 1544, the level of the voltage applied to the gate of the second sensing amplification transistor P1514 is higher than that of the voltage applied to the gate of the first sensing amplification transistor P1512. Therefore, the first sensing amplification transistor P1512 has a driving ability to supply a higher amount of current than a current supplied to the second sensing amplification transistor P1514. In the period B-C, however, because the first current is not supplied to the first sensing amplification transistor P1512, the first sensing amplification transistor P1512 fails to increase the voltage level of the data line 1542.

Then, at a point in time C, when the first control signal LACPG transitions from logic high to logic low, the first sensing amplification transistor P1512 receives the first current and increases the voltage level of the data line 1542. After the point in time C, the first sensing amplification transistor P1512 operates and, thus, the second sensing amplification transistor P1514 no longer increases the voltage level of the complementary data line 1544.

Although it is illustrated in FIGS. 15 and 16 that the first and second current sources 1530 and 1540 supply the first and second currents to the data line pair 1541, the first and second current sources 1530 and 1540 may also allow the first and second currents to flow out of the data line pair 1541. The flow of the first and second currents from the data line pair 1541 will be understood to one of ordinary skill in the art by referring to FIGS. 15 and 16 and, thus, a detailed description thereof will be omitted.

In a data sensing method according to an exemplary embodiment of the present invention, data stored in a data line pair including a data line and a complementary data line is sensed using a first sensing amplifier and a second sensing amplifier.

The data sensing method according to an exemplary embodiment of the present invention includes a precharging operation and a current control operation. In the precharging operation, the data line pair is precharged with a first voltage or a second voltage. In the current control operation, a first variable current is supplied or flowed out to the first sensing amplifier, and a second variable current is supplied or flowed out to the second sensing amplifier, such that the current amount of the first variable current is different from that of the second variable current.

In the precharging operation, the data line pair may be precharged with a ground voltage. In this case, in the current control operation, the first and second variable currents may be respectively supplied to the first and second sensing amplifiers. On the other hand, in the precharging operation, the data line pair may be precharged with a power supply voltage. In this case, in the current control operation, the first and second variable currents may be flowed out of the first and second sensing amplifiers, respectively.

When a first memory cell connected to the data line is selected, the second variable current may be increased to be higher than the first variable current. On the other hand, when a second memory cell connected to the complementary data line is selected, the second variable current may be decreased to be less than the first variable current.

While the present invention has been particularly shown and described with reference to exemplary embodiments thereof, it will be understood by one of ordinary skill in the art that various changes in form and details may be made therein without departing from the spirit and scope of the present invention, as defined by the following claims.

What is claimed is:

1. A semiconductor device comprising:
a data line pair comprising a data line and a complementary data line;
a first sensing amplification unit comprising a first sensing amplifier and a second sensing amplifier that are cross-coupled with the data line and the complementary data line;
a first variable current source supplying or flowing out a first variable current to the first sensing amplifier; and
a second variable current source supplying or flowing out a second variable current to the second sensing amplifier,
wherein a current amount of the first variable current is different from a current amount of the second variable current.

2. The semiconductor device of claim 1, wherein:
when the data line pair is precharged with a ground voltage, the first variable current source and the second variable current source supply the first and second variable currents to the first and second sensing amplifiers, respectively.

3. The semiconductor device of claim 1 wherein:
when the data line pair is precharged with a power supply voltage, the first variable current source and the second variable current source flow out the first and second variable currents to the first and second sensing amplifiers, respectively.

4. The semiconductor device of claim 1, wherein:
when a first memory cell connected to the data line is selected, the second variable current is changed to be greater than the first variable current; and
when a second memory cell connected to the complementary data line is selected, the second variable current is changed to be less than the first variable current.

5. The semiconductor device of claim 1, wherein:
the first variable current source comprises a first sub current source and a second sub current source that are connected to each other in parallel;
the second variable current source comprises a third sub current source and a fourth sub current source that are connected to each other in parallel;
when a first memory cell connected to the data line is selected, the second sub current source is inactivated; and
when a second memory cell connected to the complementary data line is selected, the fourth sub current source is inactivated.

6. The semiconductor device of claim 1, wherein:
the first sensing amplifier comprises a first MOS transistor comprising a gate connected to the complementary data line; and
the second sensing amplifier comprises a second MOS transistor comprising a gate connected to the data line.

7. The semiconductor device of claim 6, wherein:
a first end of the first MOS transistor is connected to the data line and a second end of the first MOS transistor is connected to the first variable current source; and
a first end of the second MOS transistor is connected to the complementary data line and a second end of the second MOS transistor is connected to the second variable current source.

8. The semiconductor device of claim 1, further comprising:
a first memory cell;
a second memory cell;
a first disconnection unit installed between the first memory cell and the data line, selectively connecting the first memory cell to the data line or disconnecting the first memory cell from the data line; and
a second disconnection unit installed between the second memory cell and the complementary data line, selectively connecting the second memory cell to the complementary data line or disconnecting the second memory cell from the complementary data line.

9. The semiconductor device of claim 8, wherein:
while data stored in the first memory cell is being transferred to the data line, the first disconnection unit connects the first memory cell to the data line; and
after the transfer of the data stored in the first memory cell to the data line is completed, the first disconnection unit disconnects the first memory cell from the data line;
while data stored in the second memory cell is being transferred to the complementary data line, the second disconnection unit connects the second memory cell to the complementary data line; and
after the transfer of the data stored in the second memory cell to the complementary data line is completed, the second disconnection unit disconnects the second memory cell from the complementary data line.

10. The semiconductor device of claim 1, further comprising a precharging unit precharging the data line and the complementary data line with one of a power supply voltage level and a ground voltage level.

11. The semiconductor device of claim 1, further comprising a second sensing amplification unit comprising a third sensing amplifier and a fourth sensing amplifier that are cross-coupled with the data line and the complementary data line,
wherein a control signal is applied to a node between the third sensing amplifier and the fourth sensing amplifier and is enabled after the lapse of a predetermined period of time from a point in time when the first and second variable current sources supply the first and second variable currents.

12. A semiconductor device comprising:
a plurality of data line pairs each comprising a data line and a complementary data line;
a plurality of first sensing amplification units corresponding to the plurality of data line pairs, respectively, each first sensing amplification unit comprising a first sensing amplifier and a second sensing amplifier that are cross-coupled with the data line and the complementary data line of a corresponding one of the plurality of data line pairs;
at least one first variable current source supplying or flowing out a first variable current to the first sensing amplifiers; and
at least one second variable current source supplying or flowing out a second variable current to the second sensing amplifiers.

13. The semiconductor device of claim 12, wherein:
a current amount of the first variable current is different from a current amount of the second variable current.

14. The semiconductor device of claim 12, wherein:
when a first memory cell connected to the data line is selected, the second variable current is changed to be greater than the first variable current; and
when a second memory cell connected to the complementary data line is selected, the second variable current is changed to be less than the first variable current.

15. The semiconductor device of claim 12, wherein:
when the data line pair is precharged with a ground voltage, the first variable current source and the second variable current source supply the first and second variable currents to the first and second sensing amplifiers, respectively; and
when the data line pair is precharged with a power supply voltage, the first variable current source and the second variable current source allow the first and second variable currents to flow out of the first and second sensing amplifiers, respectively.

16. The semiconductor device of claim 12, further comprising:
a first memory cell;
a second memory cell;
a first disconnection unit installed between the first memory cell and the data line, selectively connecting the first memory cell to the data line or disconnecting the first memory cell from the data line; and
a second disconnection unit installed between the second memory cell and the complementary data line, selectively connecting the second memory cell to the complementary data line or disconnecting the second memory cell from the complementary data line.

17. A semiconductor device comprising:
a data line pair comprising a data line and a complementary data line;
a first sensing amplification unit comprising a first sensing amplifier and a second sensing amplifier that are cross-coupled with the data line and the complementary data line;
a first variable current source supplying or flowing out a first current to the first sensing amplifier; and
a second variable current source supplying or flowing out a second current to the second sensing amplifier,
wherein when a first memory cell connected to the data line is selected, the second current is supplied or flowed out prior to the first current; and when a second memory cell connected to the complementary data line is selected, the first current is supplied or flowed out prior to the second current.

18. A method of sensing data stored in a data line pair comprising a data line and a complementary data line by using a first sensing amplifier and a second sensing amplifier, the method comprising:
a precharging operation of precharging the data line pair with one of a first voltage level and a second voltage level; and
a current controlling operation of supplying or flowing out a first variable current to the first sensing amplifier and supplying or flowing out a second variable current to the second sensing amplifier,
wherein a current amount of the first variable current is different from a current amount of the second variable current.

19. The method of claim 18, wherein:
the precharging operation comprises precharging the data line pair with a ground voltage; and
the current controlling operation comprises supplying the first and second variable currents to the first and second sensing amplifiers, respectively.

20. The method of claim 18, wherein:
the precharging operation comprises precharging the data line pair with a power supply voltage; and
the current controlling operation comprises allowing the first and second variable currents to flow out of the first and second sensing amplifiers, respectively.

21. The method of claim 18, wherein:
when a first memory cell connected to the data line is selected, the second variable current is changed to be greater than the first variable current; and
when a second memory cell connected to the complementary data line is selected, the second variable current is changed to be less than the first variable current.

* * * * *